United States Patent
Toombs et al.

(10) Patent No.: US 6,279,114 B1
(45) Date of Patent: Aug. 21, 2001

(54) VOLTAGE NEGOTIATION IN A SINGLE HOST MULTIPLE CARDS SYSTEM

(75) Inventors: Thomas N. Toombs, Los Gatos, CA (US); Micky Holtzman, Kfar Vradim (IL)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/185,649

(22) Filed: Nov. 4, 1998

(51) Int. Cl.[7] .............................. G06F 1/26; G06F 15/177
(52) U.S. Cl. .................................... 713/300; 713/1; 710/8
(58) Field of Search .................................. 713/300–310, 713/1, 2, 100; 710/8–19; 307/125–131; 323/265–272

(56) References Cited

U.S. PATENT DOCUMENTS

| | | |
|---|---|---|
| 4,730,251 | 3/1988 | Aakre et al. . |
| 4,910,655 | 3/1990 | Ashkin et al. . |
| 4,912,627 | 3/1990 | Ashkin et al. . |
| 4,918,598 | 4/1990 | Ashkin et al. . |
| 4,985,920 | 1/1991 | Seki . |
| 4,992,970 * | 2/1991 | Igarashi .................. 702/64 |
| 4,999,787 | 3/1991 | McNally et al. . |
| 5,016,223 | 5/1991 | Kimura et al. . |
| 5,068,894 | 11/1991 | Hoppe . |
| 5,131,091 | 7/1992 | Mizuta . |
| 5,226,006 | 7/1993 | Wang et al. . |
| 5,237,609 | 8/1993 | Kimura . |
| 5,293,424 | 3/1994 | Holtey et al. . |
| 5,319,705 | 6/1994 | Halter et al. . |
| 5,361,005 | 11/1994 | Slattery et al. . |
| 5,367,149 | 11/1994 | Takahira . |
| 5,418,752 | 5/1995 | Harari et al. . |
| 5,426,432 | 6/1995 | Sanemitsu . |
| 5,428,685 | 6/1995 | Kadooka et al. . |
| 5,450,365 * | 9/1995 | Adachi .................. 365/226 |
| 5,490,117 | 2/1996 | Oda et al. . |
| 5,499,242 | 3/1996 | Lee et al. . |
| 5,534,801 * | 7/1996 | Wu et al. .............. 327/72 |
| 5,559,965 | 9/1996 | Oztaskin et al. . |
| 5,592,641 | 1/1997 | Fandrich et al. . |
| 5,594,686 | 1/1997 | Hazen et al. . |
| 5,613,130 * | 3/1997 | Teng et al. .......... 713/300 |
| 5,613,135 | 3/1997 | Sakai et al. . |

(List continued on next page.)

FOREIGN PATENT DOCUMENTS

| | | |
|---|---|---|
| 296 13 771 U | 8/1996 | (DE) . |
| 844628 | 2/1996 | (JP) . |
| WO9701825 | 1/1997 | (WO) . |
| WO9729454 | 8/1997 | (WO) . |
| WO9738370 | 10/1997 | (WO) . |
| WO9738371 | 10/1997 | (WO) . |

OTHER PUBLICATIONS

"The MultiMediaCard System Specification," *MMCA Technical Committee*, Version 1.4, (Official Release Feb. 1988) pp. 1–106.

*Primary Examiner*—Sumati Lefkowitz
(74) *Attorney, Agent, or Firm*—Skjerven Morrill MacPherson LLP

(57) ABSTRACT

A low cost data storage and communication system. The low cost data storage and communication system has a host and at least one card connected to the host. A voltage negotiator located in the system for determining a common operating voltage range that is a common demonminator of all independent operating voltage ranges of all of the cards connected to the system. In addition, there is a novel feature of partitioning the memory storages of the card. This feature provides the host the ability to simultaneously erase any combination of sectors in a single erase group, or any combination of the entire erase groups. Another feature feature provided by this novel method of partitioning the memory storages is the ability to write protect any combination of memory groups in the card.

16 Claims, 39 Drawing Sheets

U.S. PATENT DOCUMENTS

| | | |
|---|---|---|
| 5,613,159 | 3/1997 | Colnot . |
| 5,623,637 | 4/1997 | Jones et al. . |
| 5,627,416 * | 5/1997 | Kantner ................................. 307/119 |
| 5,634,132 * | 5/1997 | Pearce et al. ........................ 713/300 |
| 5,644,750 | 7/1997 | Iijima . |
| 5,666,412 | 9/1997 | Handelman et al. . |
| 5,668,760 | 9/1997 | Hazen . |
| 5,673,316 | 9/1997 | Auerbach et al. . |
| 5,678,021 | 10/1997 | Pawate et al. . |
| 5,708,715 | 1/1998 | Vicard . |
| 5,708,799 * | 1/1998 | Gafken et al. ......................... 326/37 |
| 5,757,171 * | 5/1998 | Babcock ............................... 323/271 |
| 5,758,171 * | 5/1998 | Ramamurthy et al. ............... 713/300 |
| 5,764,761 | 6/1998 | Vicard . |
| 5,773,901 * | 6/1998 | Kantner ................................ 307/125 |
| 5,774,546 | 6/1998 | Handelman et al. . |
| 5,930,496 * | 7/1999 | MacLaren et al. .................... 439/55 |
| 5,958,056 * | 9/1999 | Lehmann ............................. 713/310 |

\* cited by examiner

| OCR BIT POSITION | VDD VOLTAGE WINDOW |
|---|---|
| 0-7 | RESERVED |
| 8 | 2.0-2.1 |
| 9 | 2.1-2.2 |
| 10 | 2.2-2.3 |
| 11 | 2.3-2.4 |
| 12 | 2.4-2.5 |
| 13 | 2.5-2.6 |
| 14 | 2.6-2.7 |
| 15 | 2.7-2.8 |
| 16 | 2.8-2.9 |
| 17 | 2.9-3.0 |
| 18 | 3.0-3.1 |
| 19 | 3.1-3.2 |
| 20 | 3.2-3.3 |
| 21 | 3.3-3.4 |
| 22 | 3.4-3.5 |
| 23 | 3.5-3.6 |
| 24-30 | RESERVED |
| 31 | CARD POWER UP STATUS BIT (BUSY)[1] |

1) THIS BIT IS SET TO LOW IF THE CARD HAS NOT FINISHED THE POWER UP ROUTINE

FIG. 15

| NAME | FIELD | WIDTH | CID-SLICE |
|---|---|---|---|
| MANUFACTURER ID | MID | 24 | [127:104] |
| CARD INDIVIDUAL NUMBER | CIN | 96 | [103:8] |
| CRC7 CHECKSUM | CRC | 7 | [7:1] |
| NOT USED, ALWAYS '1' | - | 1 | [0:0] |

FIG. 16

| NAME | FIELD | WIDTH | CELL TYPE | CSD-SLICE |
|---|---|---|---|---|
| CSD STRUCTURE | CSD_STRUCTURE | 2 | R | [127:126] |
| MMC PROTOCOL VERSION | MMC_PROT | 4 | R | [125:122] |
| RESERVED | - | 2 | R | [121:120] |
| DATA READ ACCESS-TIME-1 | TAAC | 8 | R | [119:112] |
| DATA READ ACCESS-TIME-2 IN CLK CYCLES (NSAC*100) | NSAC | 8 | R | [111:104] |
| MAX. DATA TRANSFER RATE | TRAN_SPEED | 8 | R | [103:96] |
| CARD COMMAND CLASSES | CCC | 12 | R | [95:84] |
| MAX. READ DATA BLOCK LENGTH | READ_BL_LEN | 4 | R | [83:80] |
| PARTIAL BLOCKS FOR READ ALLOWED | READ_BL_PARTIAL | 1 | R | [79:79] |
| WRITE BLOCK MISALIGNMENT | WRITE_BLK_MISALIGN | 1 | R | [78:78] |
| READ BLOCK MISALIGNMENT | READ_BLK_MISALIGN | 1 | R | [77:77] |
| DSR IMPLEMENTED | DSR_IMP | 1 | R | [76:76] |
| EXTERNAL $V_{PP}$ | VPROG | 2 | R | [75:74] |
| DEVICE SIZE MANTISSA | C_SIZE_MANT | 8 | R | [73:66] |
| DEVICE SIZE EXPONENT | C_SIZE_EXP | 4 | R | [65:62] |
| MAX. READ CURRENT @$V_{DD}$ MIN | VDD_R_CURR_MIN | 3 | R | [61:59] |
| MAX. READ CURRENT @$V_{DD}$ MAX | VDD_R_CURR_MAX | 3 | R | [58:56] |

FIG. 17A

| NAME | FIELD | WIDTH | CELL TYPE | CSD-SLICE |
|---|---|---|---|---|
| MAX. WRITE CURRENT @$V_{DD}$ MIN | VDD_W_CURR_MIN | 3 | R | [55:53] |
| MAX. WRITE CURRENT @$V_{DD}$ MAX | VDD_W_CURR_MAX | 3 | R | [52:50] |
| MAX. $V_{PP}$ CURRENT | VPP_CURR | 3 | R | [49:47] |
| ERASE SECTOR SIZE | SECTOR_SIZE | 5 | R | [46:42] |
| ERASE GROUP SIZE | ERASE_GRP_SIZE | 5 | R | [41:37] |
| WRITE PROTECT GROUP SIZE | WP_GRP_SIZE | 5 | R | [36:32] |
| WRITE PROTECT GROUP ENABLE | WP_GRP_ENABLE | 1 | R | [31:31] |
| MANUFACTURER DEFAULT ECC | DEFAULT_ECC | 2 | R | [30:29] |
| STREAM WRITE SPEED FACTOR | R2W_FACTOR | 3 | R | [28:26] |
| MAX. WRITE DATA BLOCK LENGTH | WRITE_BL_LEN | 4 | R | [25:22] |
| PARTIAL BLOCKS FOR WRITE ALLOWED | WRITE_BL_PARTIAL | 1 | R | [21:21] |
| RESERVED | - | 5 | R | [20:16] |
| RESERVED | - | 3 | R/W | [15:13] |
| COPY FLAG (OTP) | COPY | 1 | R/W | [12:12] |
| PERMANENT WRITE PROTECTION | PERM_WRITE_PROTECT | 1 | R/W | [11:11] |
| TEMPORARY WRITE PROTECTION | TMP_WRITE_PROTECT | 1 | R/W/E | [10:10] |
| ECC CODE | ECC | 2 | R/W/E | [9:8] |
| CRC | CRC | 7 | R/W/E | [7:1] |
| NOT USED, ALWAYS '1' | - | 1 | - | [0-0] |

FIG. 17B

| CSD_STRUCTURE | CSD STRUCTURE VERSION | VALID FOR MMC PROTOCOL VERSION |
|---|---|---|
| 0 | CSD VERSION NO. 1.0 | MMC PROTOCOL VERSION 1.0-1.2 |
| 1 | CSD VERSION 1.1 | MMC PROTOCOL VERSION 1.4 |
| 2-3 | RESERVED | |

FIG. 18

| MMC_PROT | MMC PROTOCOL VERSION |
|---|---|
| 0 | MMC PROTOCOL VERSION 1.0-1.2 |
| 1 | MMC PROTOCOL VERSION 1.3 |
| 2-15 | RESERVED |

FIG. 19

| TAAC BIT POSITION | CODE |
|---|---|
| 2:0 | TIME EXPONENT<br>0=1NS, 1=10NS, 2=100NS, 3=1μμS, 4=10μμS,<br>5=100μμS, 6=1MS, 7=10MS |
| 6:3 | TIME MANTISSA<br>0=RESERVED, 1=1.0, 2=1.2, 3=1.3, 4=1.5,<br>5=2.0, 6=2.5, 7=3.0, 8=3.5, 9=4.0, A=4.5<br>B=5.0, C=5.5, D=6.0, E=7.0, F=8.0 |
| 7 | RESERVED |

FIG. 20

| TRAN_SPEED BIT | CODE |
|---|---|
| 2:0 | TRANSFER RAE EXPONENT<br>0=100KBIT/S, 1=1MBIT/S, 2=10MBIT/S,<br>3=100MBIT/S, 4...7=RESERVED |
| 6:3 | TIME MANTISSA<br>0=RESERVED, 1=1.0, 2=1.2, 3=1.3, 4=1.5<br>5=2.0, 6=2.5, 7=3.0, 8=3.5, 9=4.0, A=4.5,<br>B=5.0, C=5.5, D=6.0, E=7.0, F=8.0 |
| 7 | RESERVED |

FIG. 21

| CCC BIT | SUPPORTED CARD COMMAND CLASS |
|---|---|
| 0 | CLASS 0 |
| 1 | CLASS 1 |
| ...... | |
| 11 | CLASS 11 |

FIG. 22

| BL_LEN | BLOCK LENGTH | REMARK |
|---|---|---|
| 0 | $2^0$ = 1 BYTE | |
| 1 | $2^1$ = 2 BYTES | |
| ..... | | |
| 11 | $2^{11}$ = 2048 BYTES | |
| 12-14 | RESERVED | |
| 15 | ANY | CAN BE SET BY THE HOST IN 1 BYTE STEPS BETWEEN 1 BYTE AND (THEORETICALLY) THE TOTAL DEVICE SIZE |

*FIG. 23*

| DSR_IMP | DSR TYPE |
|---|---|
| 0 | NO DSR IMPLEMENTED |
| 1 | DSR IMPLEMENTED |

*FIG. 24*

| VDD_R_CURR_MIN VDD_W_CURR_MIN | CODE FOR CURRENT CONSUMPTION @ $V_{DD}$ |
|---|---|
| 2:0 | 0=0.5mA; 1=1mA; 2=5mA; 3=10mA; 4=25mA; 5=35mA; 6=60mA; 7=100mA |

| VDD_R_CURR_MAX VDD_W_CURR_MAX | CODE FOR CURRENT CONSUMPTION @ $V_{DD}$ |
|---|---|
| 2:0 | 0=1mA; 1=5mA; 2=10mA; 3=25mA; 4=35mA; 5=45mA; 6=80mA; 7=200mA |

*FIG. 25*

| R2W_FACTOR | MULTIPLES OF READ ACCESS TIME |
|---|---|
| 0 | 1 |
| 1 | 2 (WRITE HALF AS FAST AS READ) |
| 2 | 4 |
| 3 | 8 |
| 4 | 16 |
| 5 | 32 |
| 6,7 | RESERVED |

FIG. 26

| ECC | ECC TYPE | MAXIMUM NUMBER OF CORRECTABLE BITS PER BLOCK |
|---|---|---|
| 0 | NONE (DEFAULT) | NONE |
| 1 | BCH (542,512) | 3 |
| 2-3 | RESERVED | - |

FIG. 27

| CSD FIELD | COMMAND CLASSES | | | | | | | | | |
|---|---|---|---|---|---|---|---|---|---|---|
| | 0 | 1 | 2 | 3 | 4 | 5 | 6 | 7 | 8 | 9 |
| CSD_STRUCTURE | + | + | + | + | + | + | + | + | + | + |
| MMC_PROT | + | + | + | + | + | + | + | + | + | + |
| TAAC | | + | + | + | + | + | + | + | + | |
| NSAC | | + | + | + | + | + | + | + | + | |
| TRAN_SPEED | | + | + | + | + | | | | | |
| CCC | + | + | + | + | + | + | + | + | + | + |
| READ_BL_LEN | | | + | | | | | | | |
| READ_BL_PARTIAL | | | + | | | | | | | |
| WRITE_BLK_MISALIGN | | | | | + | | | | | |
| READ_BLK_MISALIGN | | | + | | | | | | | |
| DSR_IMP | + | + | + | + | + | + | + | + | + | + |
| VPROG | | | | + | + | + | + | + | + | |
| C_SIZE_MANT | | + | + | + | + | + | + | + | + | |
| C_SIZE_EXP | | + | + | + | + | + | + | + | + | |
| VDD_R_CURR_MIN | | + | + | | | | | | | |
| VDD_R_CURR_MAX | | + | + | | | | | | | |
| VDD_W_CURR_MIN | | | | + | + | + | + | + | + | |
| VDD_W_CURR_MAX | | | | + | + | + | + | + | + | |
| VPP_CURR | | | | + | + | + | + | + | + | |
| SECTOR_SIZE | | | | | | + | + | + | + | |
| ERASE_GRP_SIZE | | | | | | + | + | + | + | |
| WP_GRP_SIZE | | | | | | | + | + | + | |
| WP_GRP_ENABLE | | | | | | | + | + | + | |
| DEFAULT_ECC | | + | + | + | + | + | + | + | + | |
| R2W_FACTOR | | | | + | + | + | + | + | + | |
| WRITE_BL_LEN | | | | + | + | + | + | + | + | |
| WRITE_BL_PARTIAL | | | | + | + | + | + | + | + | |
| COPY | + | + | + | + | + | + | + | + | + | + |
| PERM_WRITE_PROTECT | + | + | + | + | + | + | + | + | + | + |
| TMP_WRITE_PROTECT | + | + | + | + | + | + | + | + | + | + |
| ECC | | + | + | + | + | + | + | + | + | |
| CRC | + | + | + | + | + | + | + | + | + | + |

FIG. 28

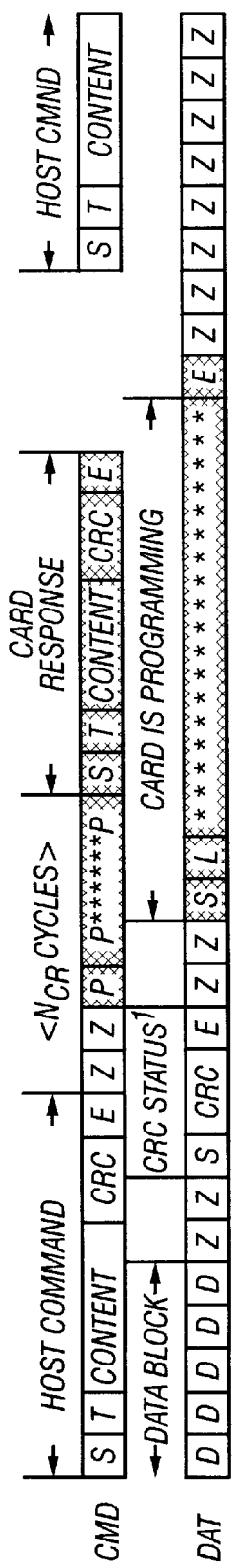
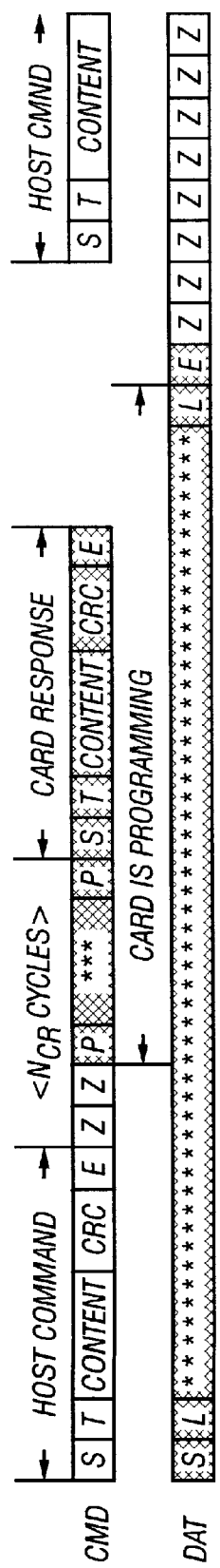
FIG. 34
FIG. 35
FIG. 36

| COMMAND CLASS (CCC) | CLASS DESCRIPTION | 0 | 1 | 2 | 3 | 4 | 7 | 9 | 10 | 11 | 12 | 13 | 15 | 16 | 17 | 18 | 20 |
|---|---|---|---|---|---|---|---|---|---|---|---|---|---|---|---|---|---|
| CLASS 0 | BASIC | + | + | + | + | + | + | + | + |  | + | + | + |  |  |  |  |
| CLASS 1 | STREAM READ |  |  |  |  |  |  |  |  | + |  |  |  |  |  |  |  |
| CLASS 2 | BLOCK READ |  |  |  |  |  |  |  |  |  |  |  |  | + | + | + |  |
| CLASS 3 | STREAM WRITE |  |  |  |  |  |  |  |  |  |  |  |  |  |  |  | + |
| CLASS 4 | BLOCK WRITE |  |  |  |  |  |  |  |  |  |  |  |  | + |  |  |  |
| CLASS 5 | ERASE |  |  |  |  |  |  |  |  |  |  |  |  |  |  |  |  |
| CLASS 6 | WRITE WRITE-PROTECTION |  |  |  |  |  |  |  |  |  |  |  |  |  |  |  |  |
| CLASS 7 | READ WRITE-PROTECTION |  |  |  |  |  |  |  |  |  |  |  |  |  |  |  |  |
| CLASS 8 | ERASE WRITE-PROTECTION |  |  |  |  |  |  |  |  |  |  |  |  |  |  |  |  |
| CLASS 9 | I/O MODE |  |  |  |  |  |  |  |  |  |  |  |  |  |  |  |  |
| CLASS 10-11 | RESERVED |  |  |  |  |  |  |  |  |  |  |  |  |  |  |  |  |

| CARD COMMAND CLASS (CCC) | CLASS DESCRIPTION | SUPPORTED COMMANDS | | | | | | | | | | | | | | |
|---|---|---|---|---|---|---|---|---|---|---|---|---|---|---|---|---|
| | | 24 | 25 | 26 | 27 | 28 | 29 | 30 | 32 | 33 | 34 | 35 | 36 | 37 | 38 | 39 | 40 |
| CLASS 0 | BASIC |  |  |  |  |  |  |  |  |  |  |  |  |  |  |  |  |
| CLASS 1 | STREAM READ |  |  |  |  |  |  |  |  |  |  |  |  |  |  |  |  |
| CLASS 2 | BLOCK READ |  |  |  |  |  |  |  |  |  |  |  |  |  |  |  |  |
| CLASS 3 | STREAM WRITE |  |  |  |  |  |  |  |  |  |  |  |  |  |  |  |  |
| CLASS 4 | BLOCK WRITE | + | + | + | + |  |  |  |  |  |  |  |  |  |  |  |  |
| CLASS 5 | ERASE |  |  |  |  |  |  |  | + | + | + | + | + | + | + |  |  |
| CLASS 6 | WRITE WRITE-PROTECTION |  |  |  |  | + |  | + |  |  |  |  |  |  |  |  |  |
| CLASS 7 | READ WRITE-PROTECTION |  |  |  |  |  |  | + |  |  |  |  |  |  |  |  |  |
| CLASS 8 | ERASE WRITE-PROTECTION |  |  |  |  | + | + | + |  |  |  |  |  |  |  |  |  |
| CLASS 9 | I/O MODE |  |  |  |  |  |  |  |  |  |  |  |  |  |  | + | + |
| CLASS 10-11 | RESERVED |  |  |  |  |  |  |  |  |  |  |  |  |  |  |  |  |

*FIG. 37*

| CMD INDEX | TYPE | ARGUMENT | RESP | ABBREVIATION | COMMAND DESCRIPTION |
|---|---|---|---|---|---|
| CMD0 | BC | [31:0] STUFF BITS | - | GO_IDLE_STATE | RESETS ALL CARDS TO IDLE STATE |
| CMD1 | BCR | [31:0] OCR WITHOUT BUSY | R3 | SEND_OP_COND | ASKS ALL CARDS IN IDLE STATE TO SEND THEIR OPERATION CONDITIONS REGISTER CONTENTS IN THE RESPONSE ON THE CMD LINE |
| CMD2 | BCR | [31:0] STUFF BITS | R2 | ALL_SEND_CID | ASKS ALL CARDS TO SEND THEIR CID NUMBERS ON THE CMD LINE |
| CMD3 | AC | [31:16] RCA [15:0] STUFF BITS | R1 | SET_RELATIVE_ADDR | ASSIGNS RELATIVE ADDRESS TO THE CARD |
| CMD4 | BC | [31:16] DSR [15:0] STUFF BITS | - | SET_DSR | PROGRAMS THE DSR OF ALL CARDS |
| CMD5 | RESERVED | | | | |
| CMD6 | RESERVED | | | | |
| CMD7 | AC | [31:16] RCA [15:0] STUFF BITS | R1 (ONLY FROM THE SELECTED CARD) | SELECT/ DESELECT_CARD | COMMAND TOGGLES A CARD BETWEEN THE STAND-BY AND TRANSFER STATES OR BETWEEN THE PROGRAMMING AND DISCONNECT STATES. IN BOTH CASES THE CARD IS SELECTED BY ITS OWN RELATIVE ADDRESS AND GETS DESELECTED BY ANY OTHER ADDRESS; ADDRESS 0 DESELECTS ALL. |
| CMD8 | RESERVED | | | | |
| CMD9 | AC | [31:16] RCA [15:0] STUFF BITS | R2 | SEND_CSD | ADDRESSED CARD SENDS ITS CARD-SPECIFIC DATA (CSD) ON THE CMD LINE |
| CMD10 | AC | [31:16] RCA [15:0] STUFF BITS | R2 | SEND_CID | ADDRESSED CARD SENDS ITS CARD IDENTIFICATION (CID) ON THE CMD LINE |
| CMD11 | ADTC | [31:0] DATA ADDRESS[1] | R1 | READ_DAT_UNTIL_STOP | READS DATA STREAM FROM THE CARD, STARTING AT THE GIVEN ADDRESS, UNTIL A STOP_TRANSMISSION FOLLOWS |
| CMD12 | AC | [31:0] STUFF BITS | R1 | STOP_TRANSMISSION | FORCES THE CARD TO STOP TRANSMISSION |

*FIG. 38A*

| CMD INDEX | TYPE | ARGUMENT | RESP | ABBREVIATION | COMMAND DESCRIPTION |
|---|---|---|---|---|---|
| CMD13 | AC | [31:16] RCA [15:0] STUFF BITS | R1 | SEND_STATUS | ADDRESSED CARD SENDS ITS STATUS REGISTER. |
| CMD14 | RESERVED | | | | |
| CMD15 | AC | [31:16] RCA [15:0] STUFF BITS | - | GO_INACTIVE_STATE | SETS THE CARD TO INACTIVE STATE IN ORDER TO PROTECT THE CARD STACK AGAINST COMMUNICATION BREAKDOWNS. |

FIG. 38B

| CMD INDEX | TYPE | ARGUMENT | RESP | ABBREVIATION | COMMAND DESCRIPTION |
|---|---|---|---|---|---|
| CMD16 | AC | [31:0] BLOCK LENGTH | R1 | SET_BLOCKLEN | SETS THE BLOCK LENGTH (IN BYTES) FOR ALL FOLLOWING BLOCK COMMANDS (READ AND WRITE). DEFAULT BLOCK LENGTH IS SPECIFIED IN THE CSD. |
| CMD17 | ADTC | [31:0] DATA ADDRESS | R1 | READ_SINGLE_BLOCK | READS A BLOCK OF THE SIZE SELECTED BY THE SET_BLOCKLEN COMMAND[1]. |
| CMD18 | ADTC | [31:0] DATA ADDRESS | R1 | READ_MULTIPLE_BLOCK | CONTINUOUSLY TRANSFERS DATA BLOCKS FROM CARD TO HOST UNTIL INTERRUPTED BY A STOP COMMAND. |
| CMD19 | RESERVED | | | | |

FIG. 39

| CMD INDEX | TYPE | ARGUMENT | RESP | ABBREVIATION | COMMAND DESCRIPTION |
|---|---|---|---|---|---|
| CMD20 | ADTC | [31:0] DATA ADDRESS | R1B | WRITE_DAT_UNTIL_STOP | WRITES DATA STREAM FROM THE HOST, STARTING AT THE GIVEN ADDRESS, UNTIL A STOP_TRANSMISSION FOLLOWS. |
| CMD21-CMD23 | RESERVED | | | | |

FIG. 40

| CMD INDEX | TYPE | ARGUMENT | RESP | ABBREVIATION | COMMAND DESCRIPTION |
|---|---|---|---|---|---|
| CMD24 | ADTC | [31:0] DATA ADDRESS | R1B | WRITE_BLOCK | WRITES A BLOCK OF THE SIZE SELECTED BY THE SET_BLOCKLEN COMMAND.¹ |
| CMD25 | ADTC | [31:0] DATA ADDRESS | R1B | WRITE_MULTIPLE_BLOCK | CONTINUOUSLY WRITES BLOCKS OF DATA UNTIL A STOP_TRANSMISSION FOLLOWS. |
| CMD26 | ADTC | [31:0] STUFF BITS | R1B | PROGRAM_CID | PROGRAMMING OF THE CARD IDENTIFICATION REGISTER. THIS COMMAND SHALL BE ISSUED ONLY ONCE PER MMC CARD. THE CARD CONTAINS HARDWARE TO PREVENT THIS OPERATION AFTER THE FIRST PROGRAMMING. NORMALLY THIS COMMAND IS RESERVED FOR THE MANUFACTURER. |
| CMD27 | ADTC | [31:0] STUFF BITS | R1B | PROGRAM_CSD | PROGRAMMING OF THE PROGRAMMABLE BITS OF THE CSD. |

FIG. 41

| CMD INDEX | TYPE | ARGUMENT | RESP | ABBREVIATION | COMMAND DESCRIPTION |
|---|---|---|---|---|---|
| CMD28 | AC | [31:0] DATA ADDRESS | R1B | SET_WRITE_PROT | IF THE CARD HAS WRITE PROTECTION FEATURES, THIS COMMAND SETS THE WRITE PROTECTION BIT OF THE ADDRESSED GROUP. THE PROPERTIES OF WRITE PROTECTION ARE CODED IN THE CARD SPECIFIC DATA (WP_GRP_SIZE). |
| CMD29 | AC | [31:0] DATA ADDRESS | R1B | CLR_WRITE_PROT | IF THE CARD PROVIDES WRITE PROTECTION FEATURES, THIS COMMAND CLEARS THE WRITE PROTECTION BIT OF THE ADDRESSED GROUP. |
| CMD30 | ADTC | [31:0] WRITE PROTECT DATA ADDRESS | R1 | SEND_WRITE_PROT | IF THE CARD PROVIDES WRITE PROTECTION FEATURES, THIS COMMAND ASKS THE CARD TO SEND THE STATUS OF THE WRITE PROTECTION BITS.[1] |
| CMD31 | RESERVED | | | | |

*FIG. 42*

| CMD INDEX | TYPE | ARGUMENT | RESP | ABBREVIATION | COMMAND DESCRIPTION |
|---|---|---|---|---|---|
| CMD32 | AC | [31:0] DATA ADDRESS | R1 | TAG_SECTOR_START | SETS THE ADDRESS OF THE FIRST SECTOR OF THE ERASE GROUP. |
| CMD33 | AC | [31:0] DATA ADDRESS | R1 | TAG_SECTOR_END | SETS THE ADDRESS OF THE LAST SECTOR IN A CONTINUOUS RANGE WITHIN THE SELECTED ERASE GROUP, OR THE ADDRESS OF A SINGLE SECTOR TO BE SELECTED FOR ERASE |
| CMD34 | AC | [31:0] DATA ADDRESS | R1 | UNTAG_SECTOR | REMOVES ONE PREVIOUSLY SELECTED SECTOR FROM THE ERASE SELECTION. |
| CMD35 | AC | [31:0] DATA ADDRESS | R1 | TAG_ERASE_GROUP_START | SETS THE ADDRESS OF THE FIRST ERASE GROUP WITHIN A RANGE TO BE SELECTED FOR ERASE |
| CMD36 | AC | [31:0] DATA ADDRESS | R1 | TAG_ERASE_GROUP_END | SETS THE ADDRESS OF THE LAST ERASE GROUP WITHIN A CONTINUOUS RANGE TO BE SELECTED FOR ERASE |
| CMD37 | AC | [31:0] DATA ADDRESS | R1 | UNTAG_ERASE_GROUP | REMOVES ONE PREVIOUSLY SELECTED ERASE GROUP FROM THE ERASE SELECTION |
| CMD38 | AC | [31:0] STUFF BITS | R1B | ERASE | ERASES ALL PREVIOUSLY SELECTED SECTORS |

*FIG. 43*

| CMD INDEX | TYPE | ARGUMENT | RESP | ABBREVIATION | COMMAND DESCRIPTION |
|---|---|---|---|---|---|
| CMD39 | AC | [31:16] RCA<br>[15:8] REGISTER ADDRESS<br>[7:0] REGISTER DATA | R4 | FAST_IO | USED TO WRITE AND READ 8 BIT (REGISTER) DATA FIELDS. THE COMMAND ADDRESSES A CARD AND A REGISTER AND PROVIDES THE DATA. THE R4 RESPONSE CONTAINS DATA READ FROM THE ADDRESSED REGISTER. THIS COMMAND ACCESSES APPLICATION DEPENDENT REGISTERS WHICH ARE NOT DEFINED IN THE MMC STANDARD. |
| CMD40 | BCR | [31:0] STUFF BITS | R5 | GO_IRQ_STATE | SETS THE SYSTEM INTO INTERRUPT MODE |
| CMD41-CMD59 | RESERVED | | | | |
| CMD60-63 | RESERVED FOR MANUFACTURER | | | | |

*FIG. 44*

| BIT POSITION | 47 | 46 | [45:40] | [39:8] | [7:1] | 0 |
|---|---|---|---|---|---|---|
| WIDTH (BITS) | 1 | 1 | 6 | 32 | 7 | 1 |
| VALUE | '0' | '0' | X | X | X | '1' |
| DESCRIPTION | START BIT | TRANSMISSION BIT | COMMAND INDEX | CARD STATUS | CRC7 | END BIT |

*FIG. 45*

| BIT POSITION | 135 | 134 | [133:128] | [127:1] | 0 |
|---|---|---|---|---|---|
| WIDTH (BITS) | 1 | 1 | 6 | 127 | 1 |
| VALUE | '0' | '0' | '111111' | X | '1' |
| DESCRIPTION | START BIT | TRANSMISSION BIT | RESERVED | CID OR CSD REGISTER INCL. INTERNAL CRC7 | END BIT |

FIG. 46

| BIT POSITION | 47 | 46 | [45:40] | [39:8] | [7:1] | 0 |
|---|---|---|---|---|---|---|
| WIDTH (BITS) | 1 | 1 | 6 | 32 | 7 | 1 |
| VALUE | '0' | '0' | '111111' | X | '1111111' | '1' |
| DESCRIPTION | START BIT | TRANSMISSION BIT | RESERVED | OCR REGISTER | RESERVED | END BIT |

FIG. 47

| BIT POSITION | 47 | 46 | [45:40] | [39:8] ARGUMENT FIELD | | | | [7:1] | 0 |
|---|---|---|---|---|---|---|---|---|---|
| WIDTH (BITS) | 1 | 1 | 6 | 16 | 8 | 8 | 8 | 7 | 1 |
| VALUE | '0' | '0' | '100111' | X | X | X | X | X | '1' |
| DESCRIPTION | START BIT | TRANSMISSION BIT | CMD39 | RCA [31:16] | REGISTER ADDR. [15:8] | READ REGISTER CONTENTS [7:0] | | CRC7 | END BIT |

FIG. 48

| BIT POSITION | 47 | 46 | [45:40] | [39:8] ARGUMENT FIELD | | [7:1] | 0 |
|---|---|---|---|---|---|---|---|
| WIDTH (BITS) | 1 | 1 | 6 | 16 | 16 | 7 | 1 |
| VALUE | '0' | '0' | '101000' | X | X | X | '1' |
| DESCRIPTION | START BIT | TRANSMISSION BIT | CMD40 | RCA [31:16] OF WINNING CARD OR OF THE HOST | [15:0] NOT DEFINED. MAY BE USED FOR IRQ DATA | CRC7 | END BIT |

FIG. 49

| BITS | IDENTIFIER | TYPE | VALUE | DESCRIPTION | CLEAR CONDITION |
|---|---|---|---|---|---|
| 31 | OUT_OF_RANGE | ER | '0'=NO ERROR '1'=ERROR | THE COMMAND'S ARGUMENT WAS OUT OF THE ALLOWED RANGE FOR THIS CARD. | C |
| 30 | ADDRESS_ERROR | ERX | '0'=NO ERROR '1'=ERROR | A MISALIGNED ADDRESS WHICH DID NOT MATCH THE BLOCK LENGTH WAS USED IN THE COMMAND. | C |
| 29 | BLOCK_LEN_ERROR | ER | '0'=NO ERROR '1'=ERROR | THE TRANSFERRED BLOCK LENGTH IS NOT ALLOWED FOR THIS CARD, OR THE NUMBER OF TRANSFERRED BYTES DOES NOT MATCH THE BLOCK LENGTH. | C |
| 28 | ERASE_SEQ_ERROR | ER | '0'=NO ERROR '1'=ERROR | AN ERROR IN THE SEQUENCE OF ERASE COMMANDS OCCURRED. | C |
| 27 | ERASE_PARAM | EX | '0'=NO ERROR '1'=ERROR | AN INVALID SELECTION OF SECTORS OR GROUPS FOR ERASE OCCURRED. | C |
| 26 | WP_VIOLATION | ERX | '0'=NOT PROTECTED '1'=PROTECTED | ATTEMPT TO PROGRAM A WRITE PROTECTED BLOCK. | C |
| 25 24 | RESERVED | | | | |
| 23 | COM_CRC_ERROR | ER | '0'=NO ERROR '1'=ERROR | THE CRC CHECK OF THE PREVIOUS COMMAND FAILED. | B |
| 22 | ILLEGAL_COMMAND | ER | '0'=NO ERROR '1'=ERROR | COMMAND NOT LEGAL FOR THE CARD STATE | B |
| 21 | CARD_ECC_FAILED | EX | '0'=SUCCESS '1'=FAILURE | CARD INTERNAL ECC WAS APPLIED BUT FAILED TO CORRECT THE DATA. | C |
| 20 | CC_ERROR | ERX | '0'=NO ERROR '1'=ERROR | INTERNAL CARD CONTROLLER ERROR | C |
| 19 | ERROR | ERX | '0'=NO ERROR '1'=ERROR | A GENERAL OR AN UNKNOWN ERROR OCCURRED DURING THE OPERATION. | C |
| 18 | UNDERRUN | EX | '0'=NO ERROR '1'=ERROR | THE CARD COULD NOT SUSTAIN DATA PROGRAMMING IN STREAM READ MODE | C |
| 17 | OVERRUN | EX | '0'=NO ERROR '1'=ERROR | THE CARD COULD NOT SUSTAIN DATA PROGRAMMING IN STREAM WRITE MODE | C |
| 16 | CID/ CSD_OVERWRITE | ER | '0'=NO ERROR '1'=ERROR | CAN BE EITHER ONE OF THE FOLLOWING ERRORS: -THE CID REGISTER HAS BEEN ALREADY WRITTEN AND CAN NOT BE OVERWRITTEN -THE READ ONLY SECTION OF THE CSD DOES NOT MATCH THE CARD CONTENT. -AN ATTEMPT TO REVERSE THE COPY (SET AS ORIGINAL) OR PERMANENT WP (UNPROTECTED) BITS WAS MADE. | C |

FIG. 50A

| BITS | IDENTIFIER | TYPE | VALUE | DESCRIPTION | CLEAR CONDITION |
|---|---|---|---|---|---|
| 15 | WP_ERASE_SKIP | SX | '0'=NOT PROTECTED '1'=PROTECTED | ONLY PARTIAL ADDRESS SPACE WAS ERASED DUE TO EXISTING WRITE PROTECTED BLOCKS. | C |
| 14 | CARD_ECC_DISABLED | SX | '0'=ENABLED '1'=DISABLED | THE COMMAND HAS BEEN EXECUTED WITHOUT USING THE INTERNAL ECC. | A |
| 13 | ERASE_RESET | SR | '0'=CLEARED '1'=SET | AN ERASE SEQUENCE WAS CLEARED BEFORE EXECUTING BECAUSE AN OUT OF ERASE SEQUENCE COMMAND WAS RECEIVED | C |
| 12:9 | CURRENT_STATE | SX | 0=IDLE 1=READY 2=IDENT 3=STBY 4=TRAN 5=DATA 6=RCV 7=PRG 8=DIS 9-15=RESERVED | STATE OF THE CARD. THE FOUR BITS ARE INTERPRETED AS A BINARY CODED NUMBER BETWEEN 0 AND 15. | B |
| 8 | READY_FOR_DATA | SX | '0'=NOT READY '1'=READY | CORRESPONDS TO BUFFER EMPTY SIGNALLING ON THE BUS | A |
| 7:0 | RESERVED | | | | |

FIG. 50B

| S | START BIT (='0') |
|---|---|
| T | TRANSMITTER BIT (HOST='1',CARD='0') |
| P | ONE-CYCLE PULL-UP (='1') |
| E | END BIT (=1) |
| Z | HIGH IMPEDANCE STATE (->='1') |
| D | DATA BITS |
| * | REPETITION |
| CRC | CYCLIC REDUNDANCY CHECK BITS (7 BITS) |
|  | CARD ACTIVE |
|  | HOST ACTIVE |
FIG. 51
FIG. 52
FIG. 53

VOLTAGE NEGOTIATION IN A SINGLE HOST MULTIPLE CARDS SYSTEM

BACKGROUND OF THE INVENTION

The present invention is directed to a low cost data storage and communication system. More particularly, the present invention relates to an universal and detachable low cost data storage and communication system.

There have been continuous development in the universal and detachable storage and communication system having detachable cards such as memory cards or I/O interfaces. These systems usually comprise a host and at least one detachable card connected to the host for providing different functions to the system. Based on different system requirements, each card may provide different functions such as being as storage device, or as a modem. Due to the capability of supporting multiple cards in a same system, the combinations provided by these cards are unlimited.

In general, these multicard systems are designed for use in a wide area of applications such as electronic toys, organizers, PDAs, cameras, smart phones, digital recorders, pagers, etc. Targeted features are high mobility and high performance at low cost price. For example, extra storage can be added to any application systems (i.e. the host), or I/O interfaces can be provided for the host to communicate with other systems.

In some circumstances, the cards of the multicard systems can be pre-loaded with application software and/or data and then sold to consumers to be used with the multicard system. In addition, the card can also comprise EEPROM or FLASH memory so that software and data can be preloaded and changed by the multicard host. The use of the multicard system as a storage device is versatile that any prestored database (e.g. dictionary, phone books, etc.) can be connected to the multicard system when needed.

However, the designers have been facing continuous obstacles in allowing the multicard systems to accept cards made from different vendors. The problems, for example, are incompatibility of operating voltages, and error correction protocols, etc.

Therefore, this invention is designed to solve the above-mentioned problems.

SUMMARY OF THE INVENTION

A MultiMediaCard system is disclosed including apparatus and methods for communicating between a host and at least one card connected to the host. In the preferred embodiment, depending on the system requirements, the card can be a storage device or an I/O interfaces.

In one aspect of the present invention, at least one card is connected to the host. Each of the cards may have its own independent operating voltage range. Therefore, a novel method is disclosed to negotiate and determine a common operation voltage range for the MultiMediaCard system in order to maintain compatibility to every card in the system.

Yet another aspect of the present invention is a method of erasing any combination of memory groups and sectors in a memory system.

Yet another aspect of the present invention is a method of providing write protection to any combinations of memory groups and sectors in the MultiMediaCard system.

Another aspect of the present invention is to provide a novel way to prevent unauthorized usage of the content of a memory card.

These and other objects and features of the invention will be better understood by reference to the detailed description which follows taken together with the drawings in which like elements are referred to by like designations throughout the several views.

BRIEF DESCRIPTION OF THE DRAWINGS

FIG. 15 shows the detail of an OCR register of a preferred embodiment according to the present invention.

FIG. 16 shows the format of a CID register of a preferred embodiment according to the present invention.

FIG. 17 shows the format of a CSD register of a preferred embodiment according to the present invention.

FIG. 18 shows the format of the CSD register structure field of the CSD register of a preferred embodiment according to the present invention.

FIG. 19 shows the format of the MultiMediaCard protocol version field of the CSD register of a preferred embodiment according to the present invention.

FIG. 20 shows the format of the TAAC field of the CSD register of a preferred embodiment according to the present invention.

FIG. 21 shows the format of the TRAN_SPEED field of the CSD register of a preferred embodiment according to the present invention.

FIG. 22 shows the format of the CCC field of the CSD register of a preferred embodiment according to the present invention.

FIG. 23 shows the format of the BL_LEN field of the CSD register of a preferred embodiment according to the present invention.

FIG. 24 shows the format of the DSR_IMP field of the CSD register of a preferred embodiment according to the present invention.

FIG. 25 shows the format of the VDD_R_CURR_MIN, VDD_R_CURR_MAX, VDD_W_CURR_MIN, and VDD_W_CURR_MAX fields of the CSD register of a preferred embodiment according to the present invention.

FIG. 26 shows the format of the R2W_FACTOR field of the CSD register of a preferred embodiment according to the present invention.

FIG. 27 shows the format of the ECC field of the CSD register of a preferred embodiment according to the present invention.

FIG. 28 shows a cross reference table of the CSD fields and different command classes of a preferred embodiment according to the present invention.

FIG. 34 shows a timing diagram for a stop transmission command issued during the transmission of a CRC status block of the preferred embodiment according to the present invention.

FIG. 35 shows a timing diagram for a stop transmission command issued when a card is busy with writing the last data block of a preferred embodiment according to the present invention.

FIG. 36 shows a timing diagram for a stop transmission command issued when a card is idle of a preferred embodiment according to the present invention.

FIG. 37 shows a table illustrating different command classes of a preferred embodiment according to the present invention.

FIG. 38 shows a table illustrating the basic commands and read stream commands (i.e. class 0 and class 1 commands) of a preferred embodiment according to the present invention.

FIG. 39 shows a table illustrating the block oriented read commands (i.e. class 2 commands) of a preferred embodiment according to the present invention.

FIG. 40 shows a table illustrating the stream write commands (i.e. class 3 commands) of a preferred embodiment according to the present invention.

FIG. 41 shows a table illustrating the block oriented write commands (i.e. class 4 commands) of a preferred embodiment according to the present invention.

FIG. 42 shows a table illustrating the group write protect commands (i.e. classes 6–8 commands) of a preferred embodiment according to the present invention.

FIG. 43 shows a table illustrating the erase commands (i.e. class 5 commands) of a preferred embodiment according to the present invention.

FIG. 44 shows a table illustrating the I/O mode commands (i.e. class 9 commands) of a preferred embodiment according to the present invention.

FIG. 45 shows a detail description of a R1 response of a preferred embodiment according to the present invention.

FIG. 46 shows a detail description of a R2 response of a preferred embodiment according to the present invention.

FIG. 47 shows a detail description of a R3 response of a preferred embodiment according to the present invention.

FIG. 48 shows a detail description of a R4 response of a preferred embodiment according to the present invention.

FIG. 49 shows a detail description of a R5 response of a preferred embodiment according to the present invention.

FIG. 50 shows a detail description of a response showing the status of a card of a preferred embodiment according to the present invention.

FIG. 51 is a table showing all the timing diagram symbols of used in the preferred embodiment according to the present invention.

FIG. 52 shows a timing diagram for a command and a response operating in the identification mode of a preferred embodiment according to the present invention.

FIG. 53 shows a timing diagram for a command and a response operating in the data transfer mode of a preferred embodiment according to the present invention.

DETAIL DESCRIPTION OF THE DRAWINGS

I. MULTIMEDIACARD SYSTEMS

Figure 1:
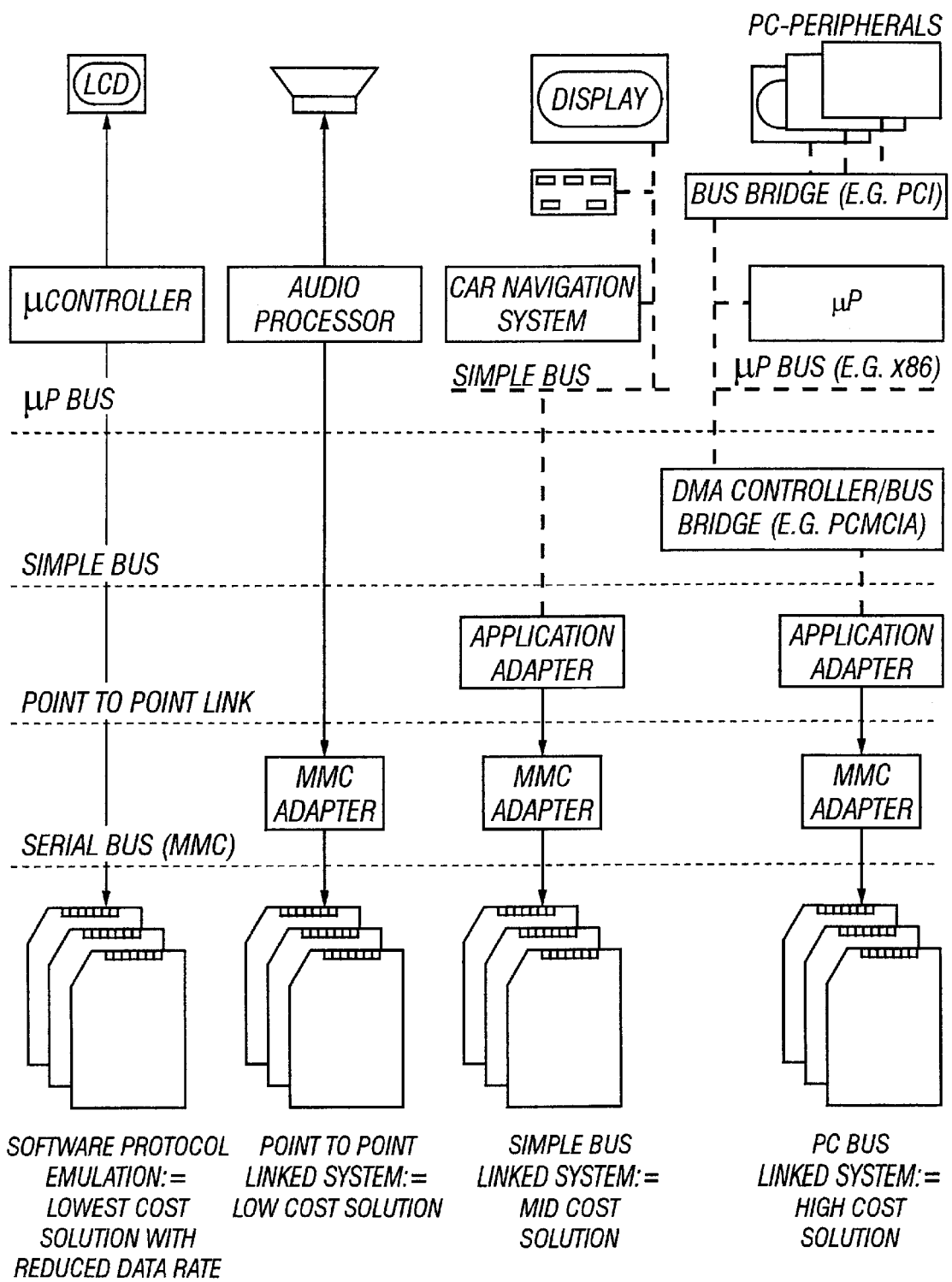
FIG. 1 shows four possible architectures of a MultiMediaCard system of the present invention.

FIG. 1 shows four possible architectures of a MultiMediaCard system according to the present invention. The four architectures of the MultiMediaCard systems are as follows:

1. Software emulation: reduced data rate (typical 100–300 Kbit per second, restricted by the host).
2. Point to point linkage: full data rate (with additional hardware).
3. Simple bus: full data rate, part of a set of addressable units.
4. PC bus: full data rate, addressable, extended functionality (like DMA capabilities)

In the first architecture according to the present invention, the MultiMediaCard bus protocol is emulated in software using three port pins of a microcontroller. This solution requires no additional hardware and is the cheapest system in the list. The other applications extend the features and requirements step by step towards a sophisticated PC solution. The various MultiMediaCard systems, although they differ in their feature set, have a basic common functionality as shown in FIG. 2.

Figure 2:
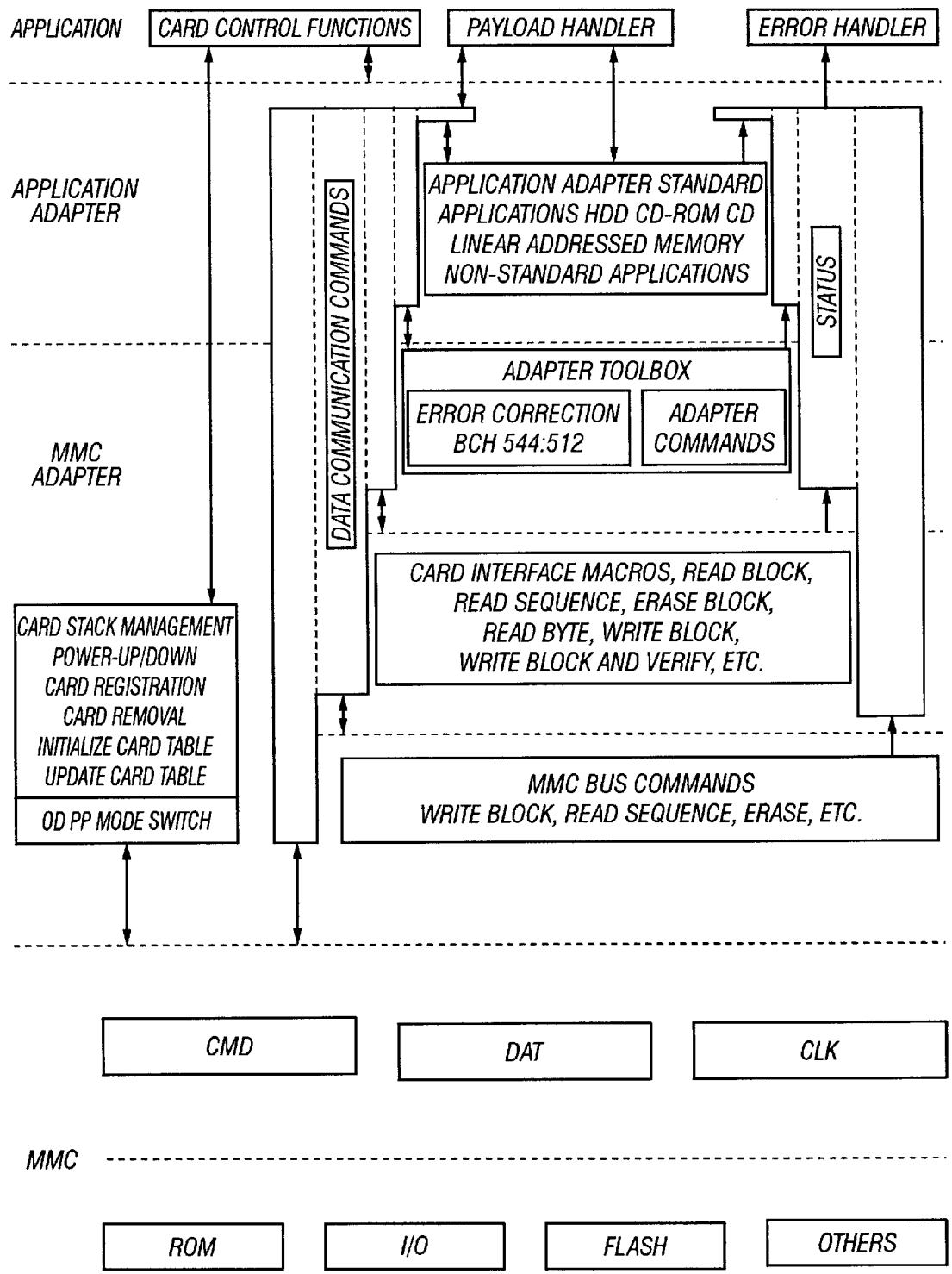
FIG. 2 shows a conceptual block diagram of a MultiMediaCard system of a preferred embodiment according to the present invention.

FIG. 2 shows a conceptual block diagram of a MultiMediaCard system of the preferred embodiment according to the present invention. The MultiMediaCard system as shown is partitioned into hierarchical layers of abstract ("virtual") components. The structure describes a logical classification functions which cover a wide variety of implementations as shown in FIG. 1.

A. Abstract Layer Model

Figure 3:
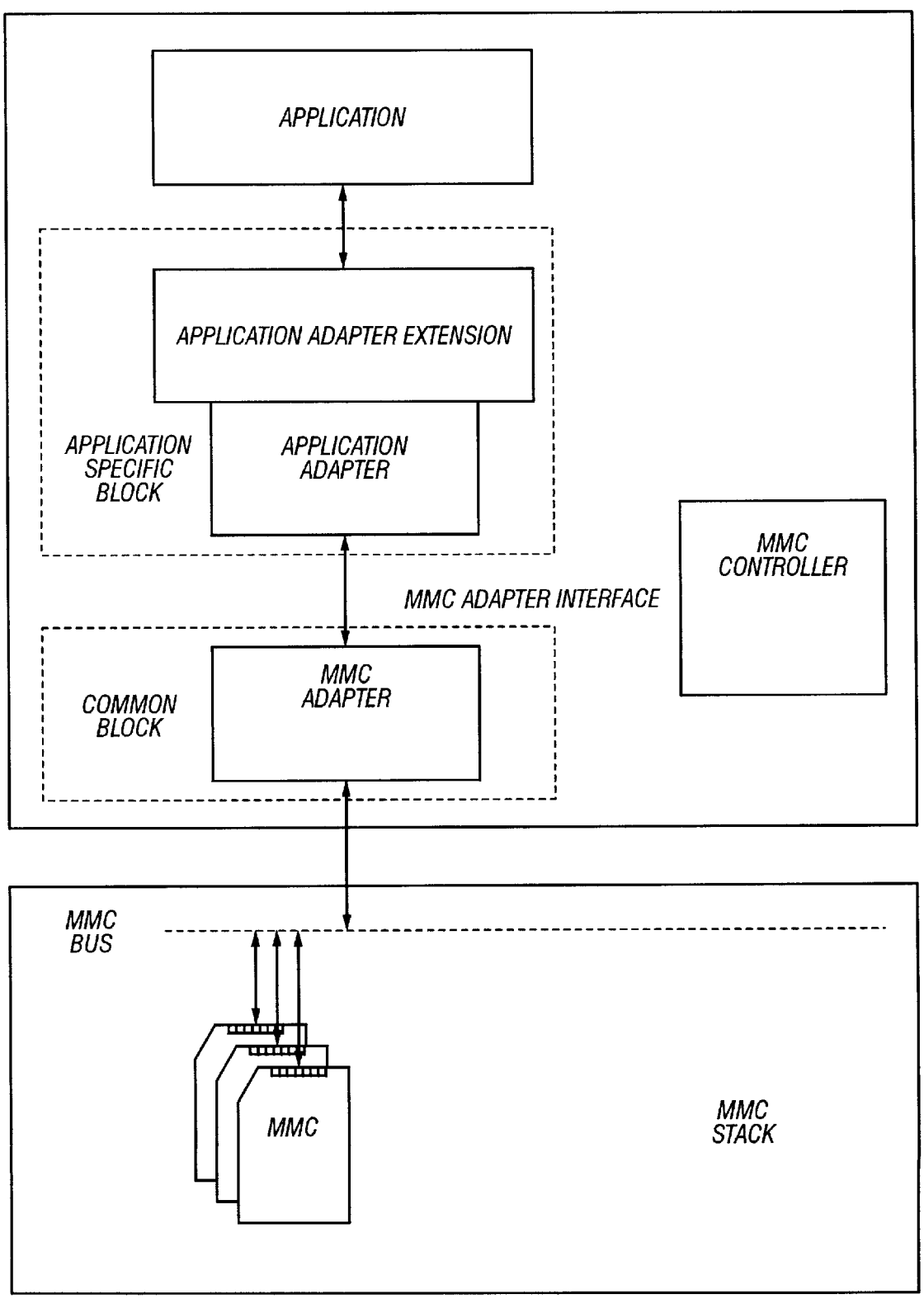
FIG. 3 shows another block diagram of a MultiMediaCard system of a preferred embodiment according to the present invention.

FIG. 3 is a block diagram of a MultiMediaCard system of a preferred embodiment according to the present invention. As shown in the figure, the MultiMediaCard system comprises at least two components: at least one MultiMediaCard card (i.e. a MultiMediaCard stack); and a MultiMediaCard controller.

In the preferred embodiment as shown, the MultiMediaCard stack comprises at least one MultMediaCard card. Each MultiMediaCard card comprises a storage unit having a plurality of memory cells, or an I/O interface unit for communicating with other MultiMediaCard units.

As shown in FIG. 3, the MultiMediaCard host of the preferred embodiment is divided into two major blocks, comprising: (1) an application specific block; and (2) a MultiMediaCard adapter.

The application specific block of the MultiMediaCard host can be implemented using a microprocessor or an adaptor complying with the standard bus protocol like USB or ATA. The function of the application specific block is to perform application oriented tasks such as display controlling or input decoding for hand-held applications. Typically, the application specific block is connected to the application as a bus slave for a standard bus.

In the preferred embodiment, the MultiMediaCard adapter of the MultiMediaCard host handles all MultiMediaCard specific functions such as initializations and error corrections. Basically, it serves as a bus master for the MultiMediaCard bus connecting the host and the cards by implementing a standard interface protocol.

B. Card Concept

In the preferred embodiment, the MultiMediaCard system handles the communications between the host and the cards via a minimal number of signals:

CLK: is a clock signal such that with each cycle of this signal an one bit transfer on the command and data lines is done.

CMD: is a bidirectional command channel used for card initialization and data transferring commands. The CMD signal has two operation modes: open-drain for initialization mode and push-pull for fast command transfer. In the preferred embodiment according to the present invention, the CMD signal is used for the communication of the commands from the MultiMediaCard host to any MultiMediaCard card of the MultiMediaCard stack. In addition, the CMD signal is also used for the communication of responses from the cards to the host.

DAT: is a bidirectional data channel for transferring data between the MultiMediaCard host and each of the cards in the MultiMediaCard stack. The DAT signal operates in push-pull mode. In the preferred embodiment, only one card or the host is driving this signal at a time.

In order to provide flexibility in the design, the MultiMediaCard of the present invention can be grouped into several card classes:

1. Read Only Memory (ROM) cards. These ROM cards are manufactured with a fixed data content. They are typically used as a distribution media for software, audio, video etc.
2. Read/Write (RW) cards (Flash, One Time Programmable ("OTP"), or Multiple Time Programmable ("MTP")). These cards are typically sold as blank (empty) media and are used for mass storage, end user recording of video, audio, or digital images.
3. I/O interface cards. These cards are intended for communication (e.g. modems) and typically have additional interface links.

It should be noted that even though each of these card classes performs different functions, all of these MultiMediaCard cards are connected directly to the MultiMediaCard host through the CLK, CMD, and DAT buses as discussed above.

C. MultiMediaCard Bus Concept

Figure 4:
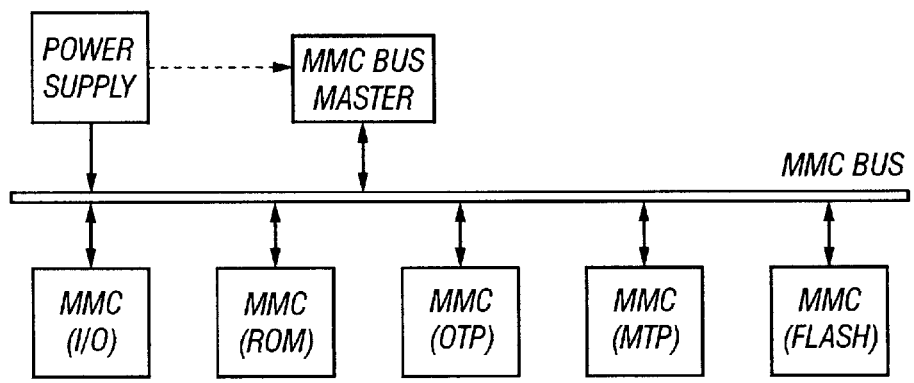
FIG. 4 shows a MultiMediaCard bus system of a preferred embodiment according to the present invention.

FIG. 4 shows a MultiMediaCard bus system of a preferred embodiment according to the present invention. As shown in the figure, the MultiMediaCard bus connects the MultiMediaCard host to each of the MultiMediaCard cards each comprising various solid-state mass storage devices, or I/O devices. This connection of the present invention can be adapted to a variety of multimedia applications. Specifically, the bus implementation as shown allows the implementation of the present invention from low-cost systems to systems with a fast data transfer rate.

In the preferred embodiment as shown, the MultiMediaCard system is a single master bus with a variable number of slaves. The MultiMediaCard bus master is the bus controller and each slave is either a single mass storage card (with possibly different technologies such as ROM, OTP, Flash etc) or an I/O card with its own controlling unit (on card) to perform the data transfer. In addition, the MultiMediaCard bus as shown in FIG. 4 also includes power connections to all the MultiMediaCards.

One aspect of the present invention is a novel bus protocol used in the MultiMediaCard bus communication in the preferred embodiment as shown. In this MultiMediaCard bus protocol, the payload data transfer between the host and the cards is specifically designed to be bidirectional so that data can be transferred between the host to the cards. Furthermore, the command bus is also designed to be bidirectional so that communication between the host and any of the cards can remain intact when the data bus is occupied by data transfer between the host and one of the card. This aspect of the present invention allows great flexibility so that the host can simultaneously control and communicate with the cards. This aspect of the invention will be discussed in detail in the following paragraphs.

1. Bus Lines

In the preferred embodiment as shown, the MultiMediaCard bus architecture requires all cards to be connected to the same set of lines. Because no card has an individual connection to the host or other devices, this design reduces the connection costs of the MultiMediaCard system.

In the preferred embodiment, the MultiMediaCard bus lines can be divided into three groups: power supply, communications (including both CMD, and DAT), and clock.

In the preferred embodiment according to the present invention, the power supply lines comprise Vss1, Vss2, and Vdd. The two Vss lines are for grounding purposes, and, in some designs, only one Vss is needed. All of these different voltages are provided to the MultiMediaCard card for performing different operations such as data read, write and erasure, etc. In addition there are two communication lines (i.e. CMD, & DAT) for bidirectional communications between the MultiMediaCard host and the MultiMediaCard cards. Finally, a clock line (i.e. CLK) is provided for the MultiMediaCard host to synchronize data transfer across the bus. The detailed operations of each bus group will be discussed in the following paragraphs.

2. Bus Protocol

In the preferred embodiment of the present invention, the MultiMediaCard system maintains a standard bus protocol in governing the communication between the MultiMediaCard host and the MultiMediaCard cards.

In the preferred embodiment of the present invention, there are three groups of communication messages between the MultiMediaCard host and the cards: Command, Response, and Data.

It is important to point out that, in the preferred embodiment according to the present invention, the commands and responses are communicated through the use of the CMD signal while the data can be simultaneously transferred between the host and one of the cards through the use of the DAT signal. Particularly, the separation of the CMD and DATA signals allows communicating between the host and the cards in the CMD signal while data is being transferred in the DAT signal.

In the preferred embodiment, command of the preferred embodiment according to the present invention is a token for starting an operation between the MultiMediaCard host and one or all of the MultiMediaCard cards in the MultiMediaCard stack. Thus, a command is sent from the host either to a single card (i.e. addressed command) or to all connected cards (i.e. broadcast command) serially through the CMD line. An addressed command comprises a specific address of a MultiMediaCard card so that only the addressed MultiMediaCard card is allow to respond to the addressed command. On the other hand, a broadcast command is sent by the host to all MultiMediaCard cards in the MultiMediaCard stack.

A response of the preferred embodiment according to the present invention is a token which is sent from an addressed card, or (synchronously) from all connected MultiMediaCard cards (responding to a broadcast command), to the MultiMediaCard host as an answer to a previously received command on the CMD line.

As discussed in the previous paragraphs, in the preferred embodiment of the present invention, data is transferred from any of the MultiMediaCard card to the MultiMediaCard host or vice versa via the DAT line.

3. Data Transfer

In the preferred embodiment of the present invention, the data transfers between the MultiMediaCard controller and the MultiMediaCard cards are also composed of these tokens.

In the addressed data transfer operations of the preferred embodiment, a command token is sometimes followed by a respond token. However, a following data token is not required by the protocol. Therefore, some operations may have a data token while the others transfer their information directly within the command or response structure.

In the preferred embodiment of the present invention, two types of data transfer commands are defined: Sequential commands, and Block-oriented commands For the sequential commands, a continuous data stream is initiated for the communications between the MultiMediaCard host and the addressed MultiMediaCard card. The data transfer is terminated only when a stop command is requested on the CMD line. This mode reduces the command overhead to an absolute minimum because the MultiMediaCard host can simultaneously communicate with the MultiMediaCard cards while the data is being transferred sequentially in the DAT line.

For the block-oriented commands, each data block is always succeeded by cyclic redundancy check ("CRC") bits. In the preferred embodiment of the present invention, both read and write operations allow either single or multiple block transmission. A multiple block transmission is terminated when a stop command follows on the CMD line that is similar to the sequential read.

Figure 5:
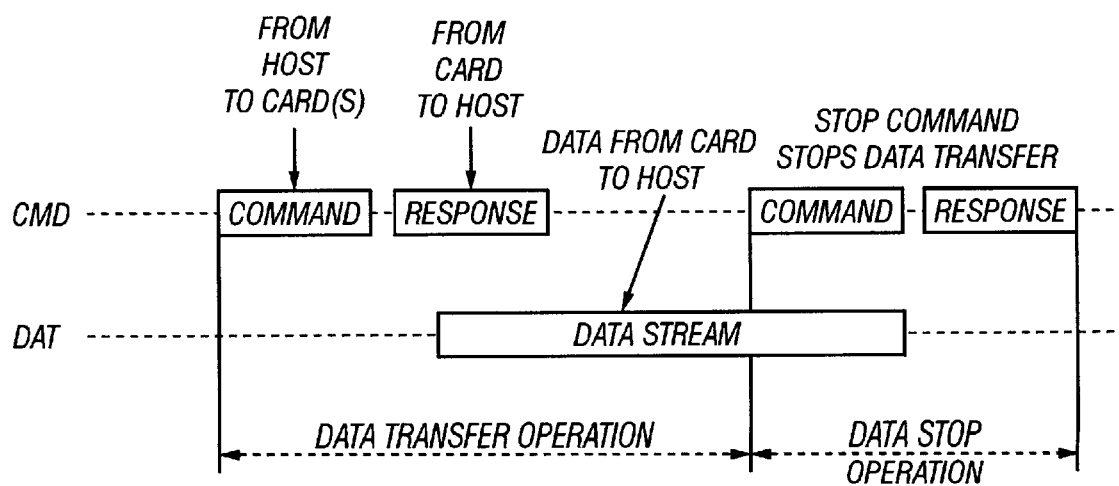
FIG. 5 shows a timing diagram of a sequential read operation of a preferred embodiment according to the present invention.

FIG. 5 shows a timing diagram of a sequential read operation of a preferred embodiment according to the present invention.

Figure 6:
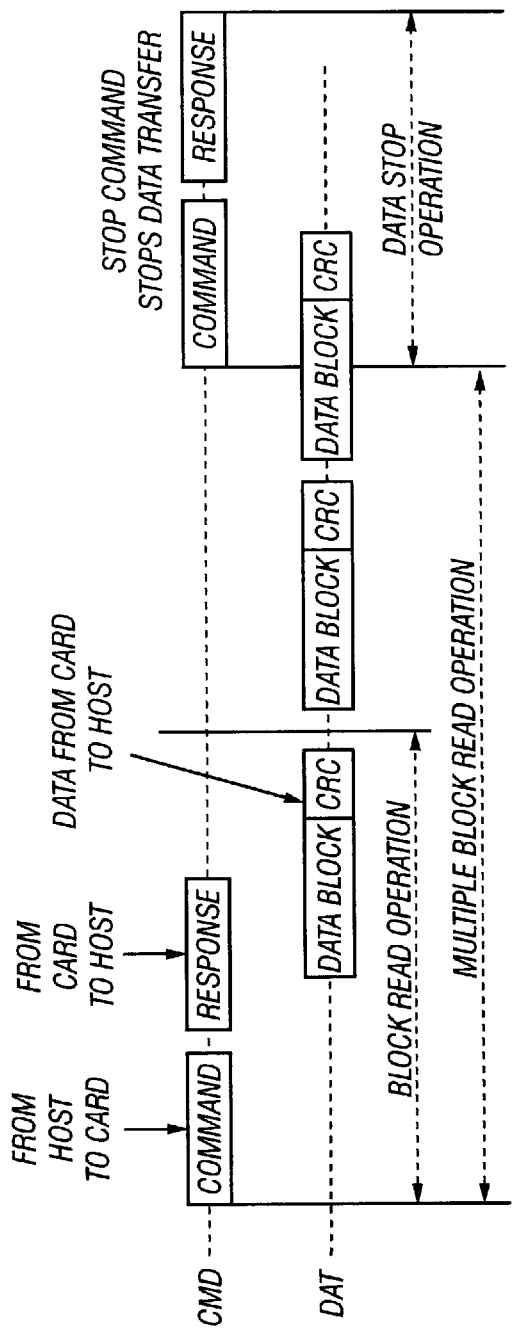
FIG. 6 shows a timing diagram of a multiple block read operation of a preferred embodiment according to the present invention.

FIG. 6 shows a timing diagram of a (multiple) block read operation of a preferred embodiment according to the present invention.

Figure 7:
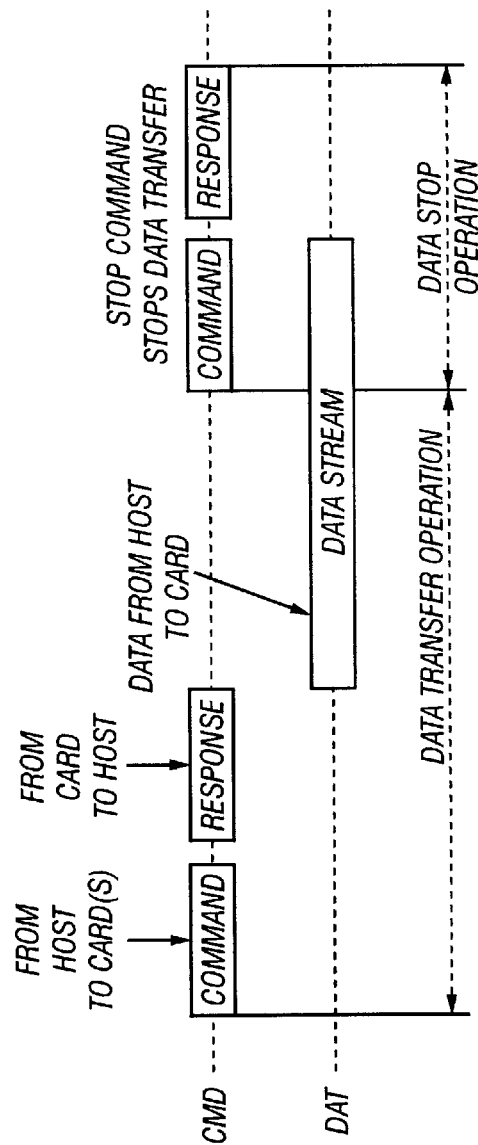
FIG. 7 shows a timing diagram of a sequential write operation of a preferred embodiment according to the present invention.

FIG. 7 shows a timing diagram of a sequential write operation of a preferred embodiment according to the present invention.

Figure 8:
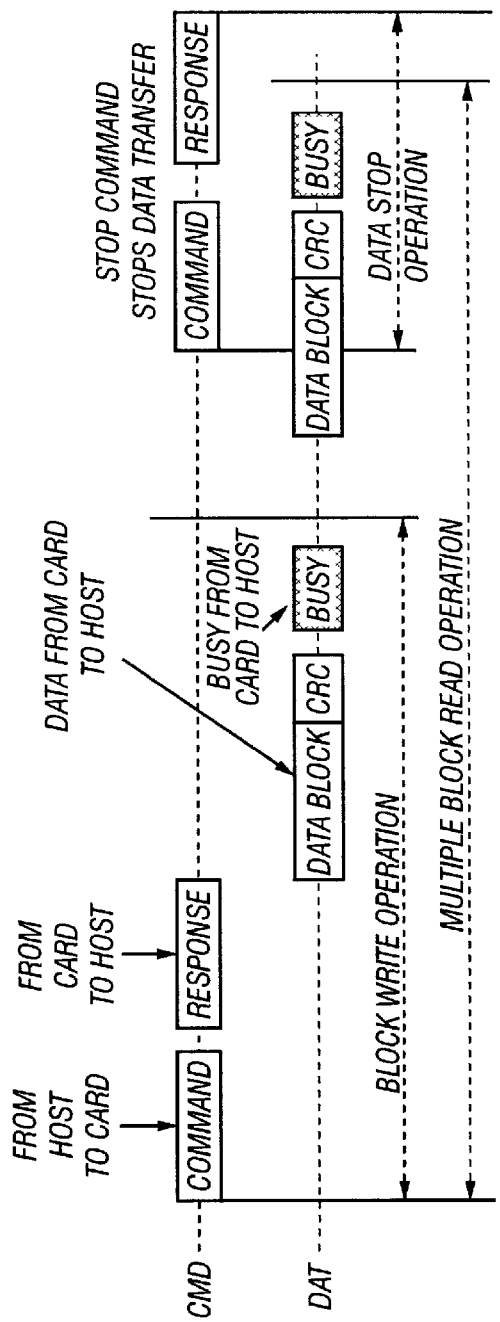
FIG. 8 shows a timing diagram of a multiple block write operation of a preferred embodiment according to the present invention.

FIG. 8 shows a timing diagram of a (multiple) block write operation of a preferred embodiment according to the present invention.

Figure 9:
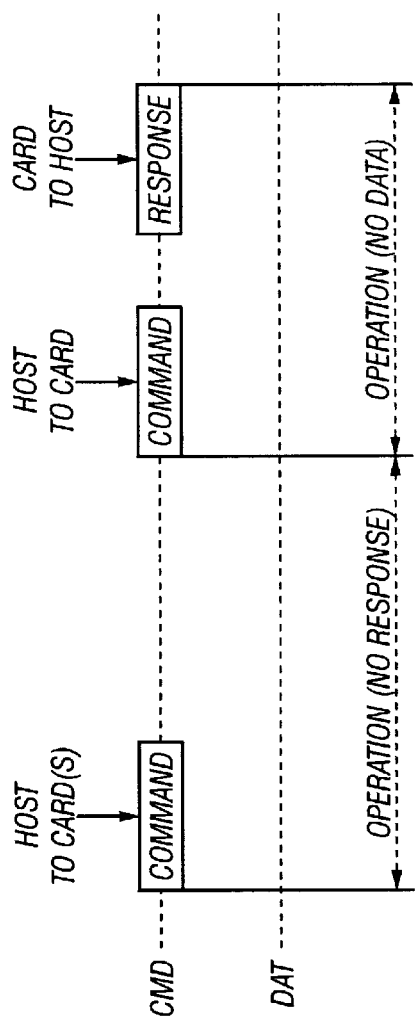
FIG. 9 shows a timing diagram showing a "no response" command and a "response, but no data" command of a preferred embodiment according to the present invention.

FIG. 9 shows a timing diagram of a "no response" command and a "no data" operation command of a preferred embodiment according to the present invention.

Figure 10:
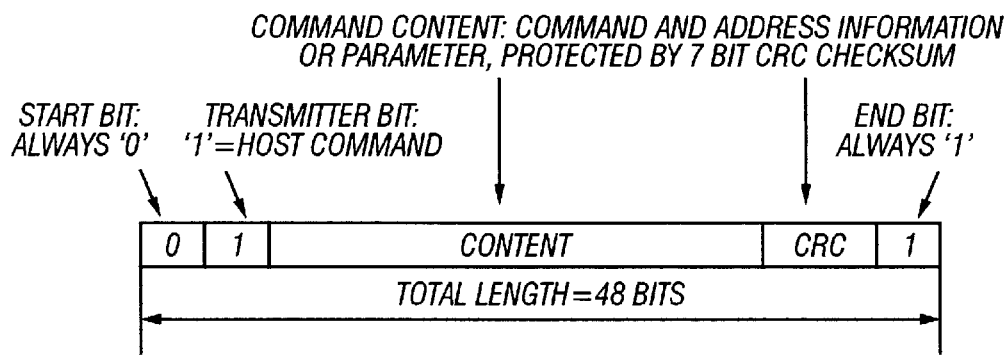
FIG. 10 shows a command token format of a preferred embodiment according to the present invention.

FIG. 10 shows a command token format of a preferred embodiment according to the present invention. Each command token is preceded by a start bit ('0') and succeeded by an end bit ('1'). The total length of the preferred embodiment is 48 bits. Each token is protected by CRC bits so that transmission errors can be detected, the operation may be repeated if errors are detected.

Figure 11:
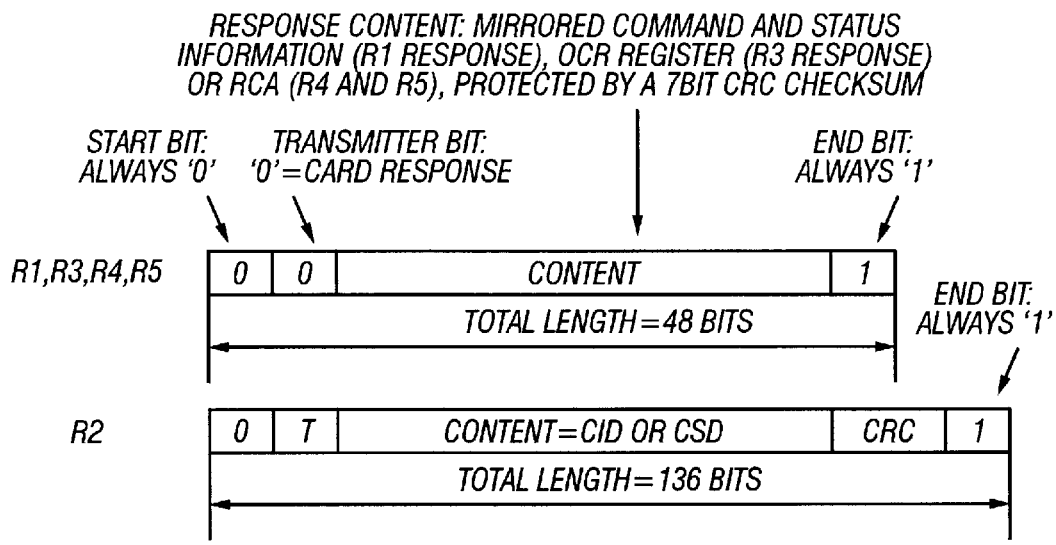
FIG. 11 shows a response token format of a preferred embodiment according to the present invention.

FIG. 11 shows a response token format of a preferred embodiment according to the present invention. The response token comprises five coding schemes depending on their content, which will be discussed in the following paragraphs. The token length as shown in the figure is either 48 or 136 bits.

Figure 12:
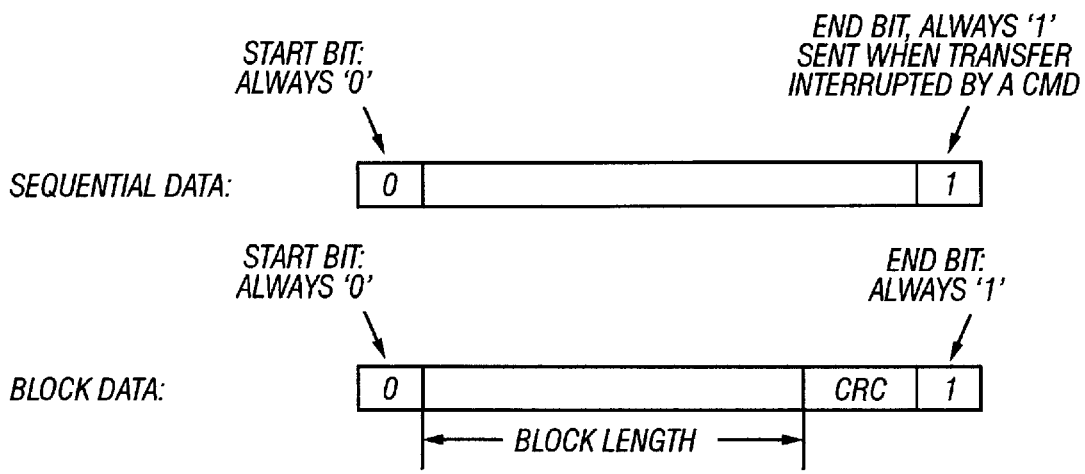
FIG. 12 shows a data packet format of a preferred embodiment according to the present invention.

FIG. 12 shows a data packet format for a sequential data and a block data of a preferred embodiment according to the present invention. It should be noted that since there is no predefined end in sequential data transfer, the CRC protection is not required.

D. MultiMediaCard Host

Figure 13:
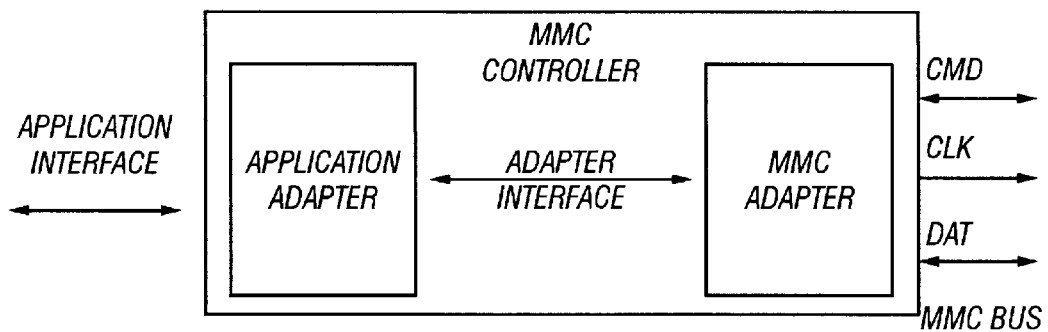
FIG. 13 shows a MultiMediaCard host controller scheme of a preferred embodiment according to the present invention.

FIG. 13 shows a MultiMediaCard host of a preferred embodiment according to the present invention. Under this preferred embodiment, the MultiMediaCard host is responsible for (1) handling the protocol translation from standard MultiMediaCard bus to application bus; (2) error correction capability; (3) data buffering to enable minimal data access latency; (4) MultiMediaCard stack management to relieve the application processor; (5) handling macros for common complex command sequences.

Specifically, the MultiMediaCard host of this preferred embodiment is the link between the application and the MultiMediaCard bus with its MultiMediaCard cards. It translates the standard MultiMediaCard protocol to a protocol used in the application bus. The preferred embodiment as shown in FIG. 13 comprises two major parts: the application adapter; and the MultiMediaCard adapter.

In the preferred embodiment as shown in FIG. 13, the application adapter is in a minimum configuration of a bus slave and a bridge into the MultiMediaCard system. In other designs, the application adapter can be extended to become a master on the application bus and support functions like DMA or serve application specific needs. Higher integration can combine the MultiMediaCard host with the application.

II. MULTIMEDIACARD CARD REGISTERS

Figure 14:
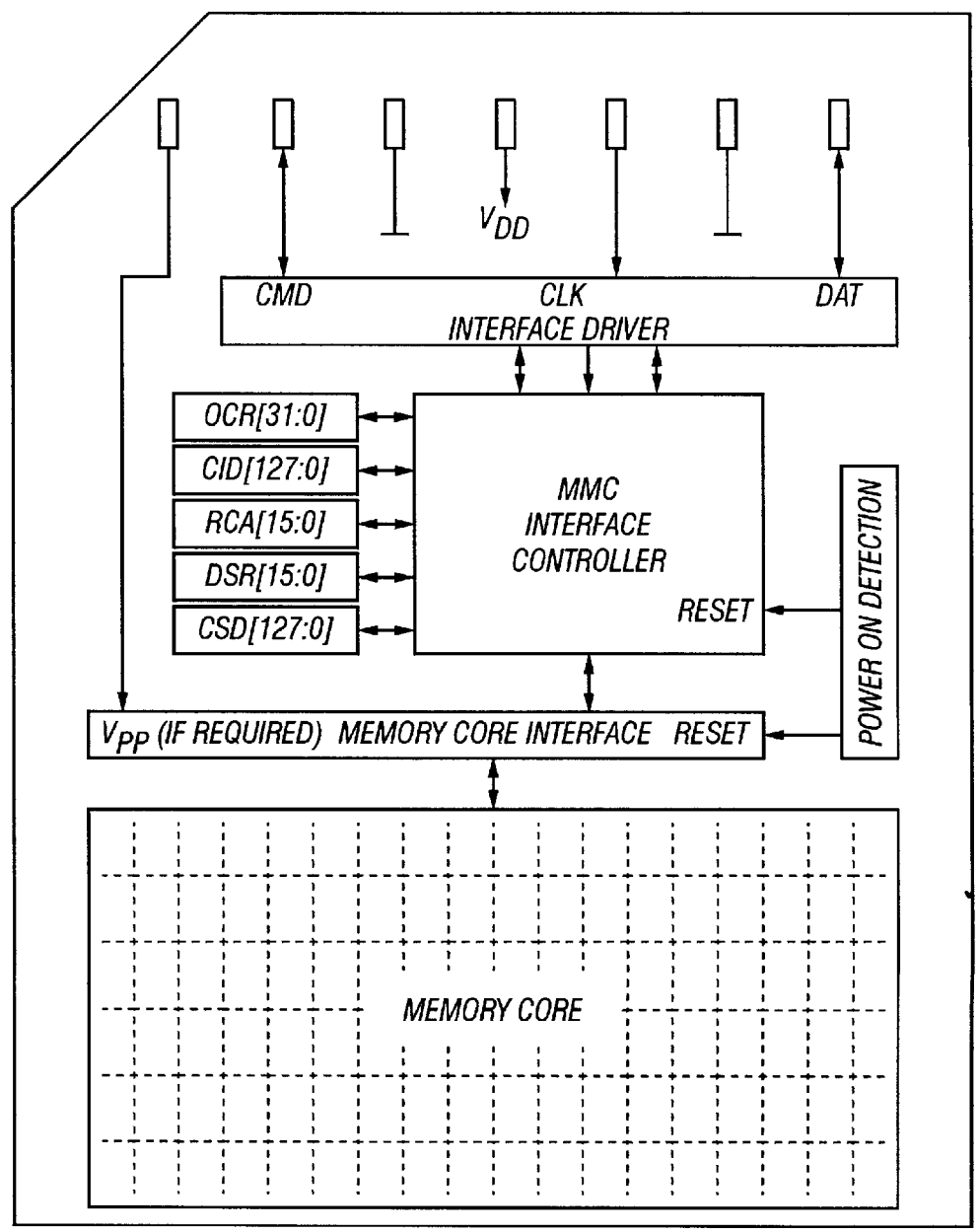
FIG. 14 shows the architecture of a MultiMediaCard card of a preferred embodiment according to the present invention.

In order to fully present the communication protocol implemented in the preferred embodiment according to the present invention, the following is a detail description on the various internal registers of a MultiMediaCard card. In the preferred embodiment as shown in FIG. 14, each of the cards of the MultiMediaCard system comprises a group of registers for storing a variety of status and internal information. In addition, these registers are used for providing information to the host system for determining the communication protocol between the host and the cards. In the preferred embodiment, five registers, OCR, CID, CSD, RCA, and DSR are used to store the information. These registers can be accessed by the host by issuing a specific set of commands.

Specifically, the OCR, CID and CSD registers carry the card/content specific information, while the RCA and DSR registers are configuration registers storing actual configuration parameters.

A. OCR Register

FIG. 15 shows the format of an OCR register of the preferred embodiment according to the present invention. The OCR register as shown is a 32-bit register storing the Vdd voltage profile of the card. In addition, the OCR register also includes a status information bit (i.e. bit 31). This status bit is set if the card power up procedure has been finished. In the preferred embodiment, the register can be designated as read only. The OCR register is implemented by the cards which do not support the full operating voltage range of the MultiMediaCard bus, or if the card power up extends the definition in the timing diagram.

To indicate the operating voltage range for the MultiMediaCard card, the corresponding bits indicating the voltage bit supported by the card are set to high. On the other hand, the voltages are not supported if the corresponding bits are set to LOW. For example, a MultiMediaCard card having an independent operating voltage range of 2.6–3.4 V has a OCR value of:

00000000 00000111 11111000 00000000

B. CID Register

In the preferred embodiment of the present invention, the CID register carries a card identification number (Card ID) used during the card identification procedure. As shown in FIG. 16, the CID register of the preferred embodiment is a 128-bit wide register divided into three slices: Manufacturer ID, Card Individual Number, and CRC7 checksum.

C. CSD Register

FIG. 17 shows the format of a Card-Specific Data register (CSD) of a preferred embodiment according to the present invention. The CSD register is responsible for providing information to the MultiMediaCard host on how to access the card content. Specifically, the CSD register stores values defining the data format, error correction type, maximum data access time, data transfer speed, whether the DSR register can be used, etc. The type of the entries is coded as follow: R=readable, W=writeable once, E=erasable (multiple writable). The programmable part of the register (i.e. entries marked by W or E) can be changed by the command CMD 27 issued by the MultiMediaCard host.

The following paragraphs discuss in detail the preferred embodiment of the present invention of various CSD fields and the relevant data types:

FIG. 18 shows the detail of the CSD_STRUCTURE field of the CSD register of the preferred embodiment according to the present invention. This field is used to indicate the current version of the CSD register.

FIG. 19 shows the format of the MMC_PORT field of the CSD register of the preferred embodiment according to the present invention. The MMC_PORT field indicates the current MultiMediaCard protocol version implemented by the cards. The MultMediaCard protocol includes the definition of the command set and the card responses.

FIG. 20 shows the format of the TAAC field of the CSD register of a preferred embodiment according to the present invention. The TAAC field is used to indicate the data access time during asynchronous data transmission.

The NSAC field (not shown) of the preferred embodiment according to the present invention is used to indicate the worst case scenario for the clock dependent factor of the data access time. The unit for NSAC of the preferred embodiment according to the present invention is 100 clock cycles. Therefore, the maximal value for the clock dependent part of the data access time is 25.5. K cycles.

FIG. 21 shows the format of the TRAN_SPEED field of the CSD register of the preferred embodiment according to the present invention. The TRAN_SPPED field is used to indicate the maximum data transfer rate of the MultiMediaCard card.

FIG. 22 shows the format of the CCC field of the CSD register of the preferred embodiment according to the present invention. The CCC field is used to indicate the supported card command classes of the MultiMediaCard card. Specifically, the MultiMediaCard command set is divided into different subsets (command classes). The card command class (CCC) field defines which command classes are supported by this card. A value of "1" in a CCC bit means that the corresponding command class is supported.

FIG. 23 shows the format of the READ_BL_LEN field of the CSD register of the preferred embodiment according to the present invention. The data block length can be computed as $2^{READ\_BL\_LEN}$. The block length might therefore be in the range of 1, 2, 4 . . . 2048 bytes.

In addition, the READ_BL_PARTLAL field of the preferred embodiment according to the present invention is used to indicate whether the partial block sizes can be used in block read command. When the READ_BL_PARTIAL=0, only the READ_BL_LEN block size can be used for block oriented data transfers. On the other hand, when READ_BL_PARTIAL=1, smaller blocks can be used as well. The minimum block size will be equal to minimum addressable unit (one byte).

The WRITE_BLK_MISALIGN field of the preferred embodiment according to the present invention is used to indicate whether the data block to be written by one command can be spread over more than one physical block of the memory device. The size of the memory block is defined in WRITE_BL_LEN (similar representation as with the READ_BL_LEN). When the WRITE_BLK_MISALIGN=0, the crossing physical block boundaries is invalid. On the other hand, when the WRITE_BLK_MISALIGN=1, the crossing of physical block boundaries is allowed.

Similarly, the READ_BLK_MISALIGN field of the preferred embodiment according to the present invention is used to indicate whether the data block to be read by one command can be spread over more than one physical block of the memory device. The size of the memory block is defined in READ_BL_LEN. When the READ_BLK_MISALIGN=0, the crossing block boundaries is invalid. On the other hand, when the READ_BLK_MISALIGN=1, the crossing physical block boundaries is allowed.

FIG. 24 shows the format of the DSR_IMP field of the CSD register of the preferred embodiment according to the present invention. The DSR_IMP field is used to indicate whether the configuration driver stage is integrated on the card. If the DSR_IMP field is set, a driver stage register (DSR) must be implemented also.

In the preferred embodiment, if the card is a storage element, the storage capacity of the card is computed from the entries C_SIZE, C_SIZE_MULT and READ_BL_LEN as follows:

memory capacity = BLOCKNR * BLOCK_LEN
where
    BLOCKNR = (C_SIZE+1) * MULT
    MULT = $2^{C\_SIZE\_MULT+2}$    (C_SIZE_MULT < 8)
    BLOCK_LEN = $2^{READ\_BL\_LEN}$    (READ_BL_LEN < 12)

Therefore, the maximal capacity in this preferred embodiment is 4096*512*2048=4 Gbytes. For example, a 4 Mbyte card with BLOCK_LEN=512 can be coded by C_SIZE_MULT=0 and C_SIZE=2047.

FIG. 25 shows the formats of the VDD_R_CURR_MIN, VDD_R_CURR_MAX, VDD_W_CURR_MIN, and VDD_W_CURR_MAX fields of the CSD register of the preferred embodiment according to the present invention. These fields are used for indicating the minimum and maximum values for read and write currents on the VDD power supply.

The SECTOR_SIZE field (not shown) of the preferred embodiment according to the present invention is used to indicate the size of an erasable sector. The content of this register is a 5 bit coded value, defining the number of write blocks (see WRITE_BL_LEN). The size of the current erasable sector can be computed by increasing this number by one. For example, a value of zero means 1 write block, and a value of 31 means 32 blocks.

The ERASE_GRP_SIZE field of the preferred embodiment according to the present invention is used to indicate the size of an erasable group. The content of this field is a 5 bit binary coded value, defining the number of sectors (see SECTOR_SIZE). The actual size of the current erasable group is computed by increasing this number by one. For example, a value of zero means 1 sector, a value of 31 means 32 sectors.

The WP_GRP_SIZE field of the preferred embodiment according to the present invention is used to indicate the size of a write protected group. The content of this field is a 5 bit binary coded value, defining the number of sectors (see SECTOR_SIZE). The actual size of the current write protected group is computed by increasing this number by one. For example, a value of zero means 1 erase group, a value of 31 means 32 write protected groups.

The WP_GRP_ENABLE field of the preferred embodiment according to the present invention is used to indicate whether the write protection group is enabled. A value of "0" means the group write protection is disabled.

The DEFAULT_ECC field of the preferred embodiment according to the present invention is set by the card manufacturer. This field indicates whether the ECC code is recommended.

FIG. 26 shows the format of the R2W_FACTOR field of the CSD register of the preferred embodiment according to the present invention. The R2W_FACTOR field is used to indicate the typical block program time as a multiple of the read access time.

The WRITE_BL_LEN of the preferred embodiment according to the present invention is used to indicate the block length for write operations. See READ_BL_LEN for field coding.

The WRITE_BL_PARTIAL field of the preferred embodiment according to the present invention indicates whether partial block sizes can be used in block write commands. When WRITE_BL_PARTIAL=0, only the WRITE_BL_LEN block size can be used for block oriented data write. On the other hand, when WRITE_BL_PARTIAL=1, the smaller blocks can be used as well. The minimum block size is one byte.

The COPY field of the preferred embodiment according to the present invention indicates whether the content is original (='0') or has been copied (='1'). Particularly, the COPY bit for OTP and MTP devices sold to end consumers are normally set to '1' to identify the card contents as a copy. Preferably, the COPY bit is an one time programmable bit.

The PERM_WRITE_PROTECT of the preferred embodiment according to the present invention permanently protects the whole card content against overwriting or erasing (all write and erase commands for this card are permanently disabled). The default value is '0 ', i.e., not permanently write protected.

The TMP_WRITE_PROTECT field of the preferred embodiment according to the present invention temporarily protects the whole card content against overwriting or erasing (all write and erase commands for this card are permanently disabled). This bit can be set and reset. The default value is '0', that is, not write protected.

FIG. 27 shows the format of the ECC field of the CSD register of the preferred embodiment according to the present invention. The ECC field is used to indicate the ECC code that is used for storing data on the card. This field is used by the host (or application) to decode the data read from the card.

The CRC field carries the check sum for the CSD contents. The checksum has to be recalculated by the host for any CSD modification. The default corresponds to the initial CSD contents.

As discussed above, each of the CSD fields to different command classes. FIG. 28 shows a cross reference table of the CSD fields and different command classes of the preferred embodiment according to the present invention. A '+' indicates that the CSD field affects the commands of the related command classes.

D. RCA Register

In the preferred embodiment according to the present invention, the relative card address register (RCA) is a writable 16-bit register carrying the card address assigned by the host during the card identification. This address is used for the addressed host-card communication after the card identification procedure. In the preferred embodiment, the default value of the RCA register is 0x0001. In addition, the value 0x0000 is reserved to set all cards into the Stand-by State with CMD7.

E. DSR Register

In the preferred embodiment according to the present invention, the driver stage register (DSR) is a 16-bit register. It can be optionally used to improve the bus performance for extended operating conditions (depending on parameters like bus length, transfer rate or number of cards). Particularly, the CSD register carries the information about the DSR register usage in its DSR_IMP field. In the preferred embodiment, the default value of the DSR register is 0x404.

II. FUNCTIONAL DESCRIPTIONS

A. Operation Modes

In the preferred embodiment, the MultiMediaCard system of the present invention defines three operation modes: Card Identification Mode; Interrupt Mode; and Data Transfer Mode.

Figure 29:
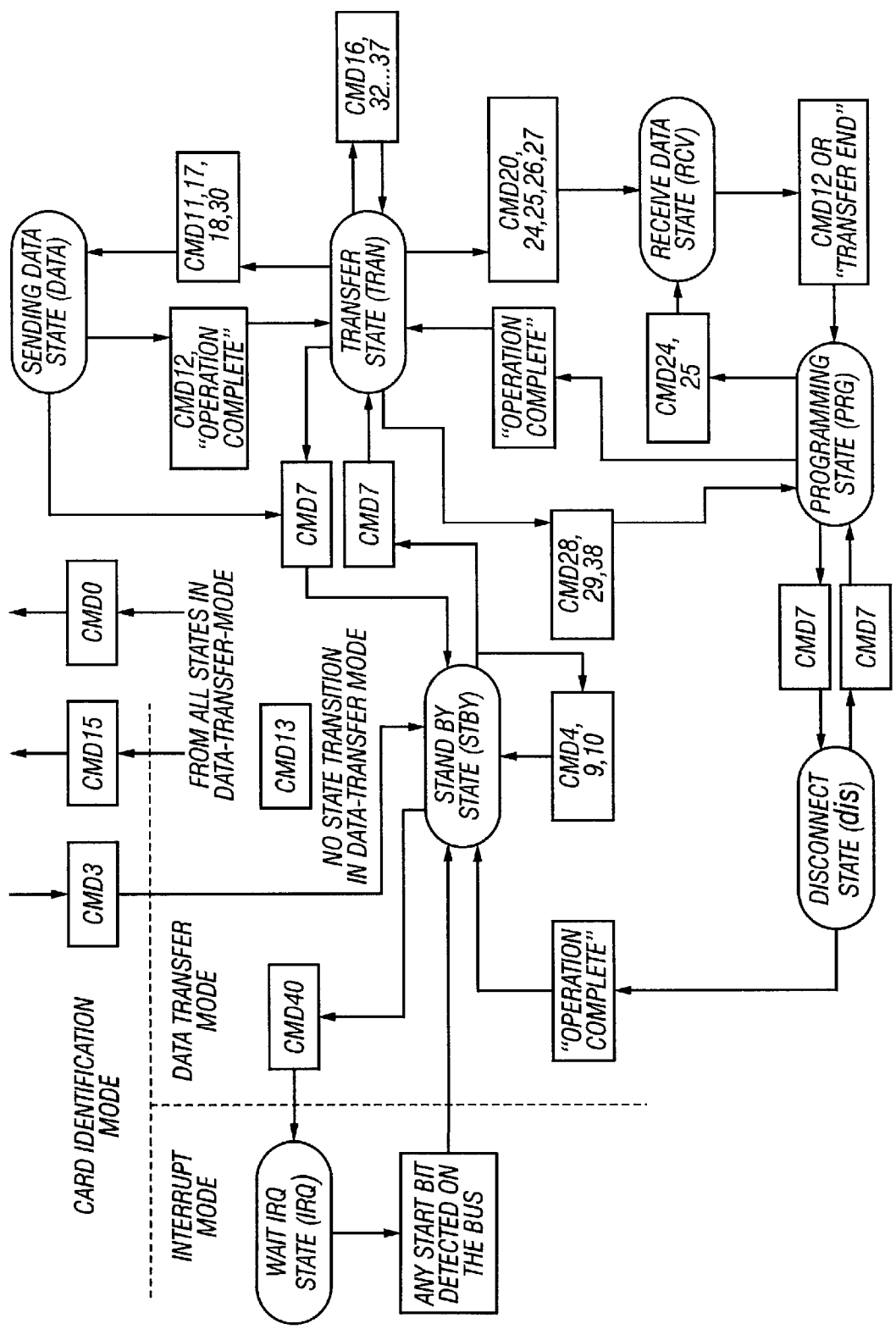
FIG. 29 is a state diagram showing different modes of a MultiMediaCard system of a preferred embodiment according to the present invention.

FIG. 29 shows a state diagram showing different modes of a MultiMediaCard system of the preferred embodiment according to the present invention. The figure illustrates the relationships between the various operation modes of the preferred embodiment according to the present invention. As shown in the figure, the MultiMediaCard card shifts between each mode in respond to the commands from the MultiMediaCard host. For example, by issuing a CMD0 command, the host can shift the MultiMediaCard card from the data transfer mode to the card identification mode. Similarly, by issuing a CMD40 command, the MultiMediaCard card can be shifted from the data transfer mode to the interrupt mode.

In addition, there are three major states in the data transfer mode: Stand-by State (stby); Transfer State (tran); and Disconnect State (dis).

In the Stand-by State, none of the MultiMediaCard card is selected so that there is not any data transfer between the MultiMediaCard host and any of the MultiMediaCard card.

In the Transfer State, one of the MultiMediaCard cards is selected by the host using an addressed command. The card is selected for data transfer with the host. Specifically, the data bus is locked for the data transfer between the selected MultiMediaCard card and the host. Even though the data bus is locked for the data transfer, the host of the present invention can still use the command bus to communicate with the any of the MultiMediaCard cards. It should be pointed out that, for the present invention, commands and responses between the host and the MultiMediaCard cards are handled by the command bus whereas data is transferred between the host and the MultiMediaCard cards in the data bus. This aspect of the present invention provides a novel way of simultaneously transferring data and communicating between the host and the MultiMediaCard cards.

In the stand-by mode, any of the MultiMediaCard cards can be selected and designated by the addressed command CMD7 for data transfer. The selected card is then placed in the Transfer State. As discussed above, however, only one card can be selected for the data transfer at a given time.

As shown in FIG. 29, if the MultiMediaCard host intends to read data from a selected card, the MultiMediaCard host will issue an address command of data read (CMD 11, 17, 18, or 30) to switch the addressed card to a sending-data state (data). When the MultiMediaCard host finishes reading data from the selected card, the MultiMediaCard host will then instruct the MultiMediaCard card to (1) continue to transfer data by remaining in the Transfer State, or (2) return to stand-by state again by deselecting the card using the command CMD7. It should be noted that, by deselecting the card using the command CMD7, the data bus is also released so that another card can be selected for data transfer.

Similarly, if the host intends to write data to any of the MultiMediaCard cards, the host will issue an addressed data write command (e.g. CMD 24, 25, 26, or 27) to switch the selected MultiMediaCard card into a receive-data state (rcv). In this state, data can be written to the memory of the cards, or to the internal registers such as the CID register or the CSD register. When the MultiMediaCard host finishes writing data to the selected card, the MultiMediaCard host will then instruct the MultiMediaCard card to (1) continue to receive data by remaining in the receive-data state; or (2) return to stand-by state again by deselecting the card using the command CMD7. Similarly, by deselecting the card using the command CMD7, the data bus is also released so that another card can be selected for data transfer.

Because of the ability to maintain communication between the MultiMediaCard host and any of the MultiMediaCard cards using the CMD signal while data is being transferred in the DAT signal, the MultiMediaCard host can issue a stop command CMD12 to stop the data transfer (either writing or reading data to and from the card) at any time during the data transfer. Upon receiving the stop command CMD12, the MultiMediaCard card will terminate the data transfer and return to the Transfer State.

If a stream write operation is stopped prior to reaching the block boundary and partial block data transfer is allowed (as defined in the CSD), the part of the last block will be packed as a partial block and programmed. If partial blocks are not allowed, the remaining data will be discarded.

As soon as the data transfer is completed, the card will exit the data write state and move to the programming.

If a block write operation is stopped and the block length and the CRC of the last block are valid, the data will be written into the card.

If data transfer in stream write mode is stopped and not byte aligned, the bits of the incomplete byte are ignored and not written into the card.

It should be noted that, in any instances, the host can enter the card identification mode and begin looking for new card(s) connected on the bus.

When there is an interrupt in the system, both host and all cards will enter and exit interrupt mode simultaneously. During the interrupt mode, there is no data transfer between the host and the MultiMediaCard cards. The only message allowed is an interrupt service request from one of the cards or the host.

After a card is identified by the host, the identified card will be assigned with an RCA and then the card can enter data transfer mode. The host can enter data transfer mode anytime after identifying any one of the cards connected to the bus.

B. Card Identification Mode

In the preferred embodiment as shown, during the card identification mode, the host of a MultiMediaCard system first negotiates and validates a common operation voltage range among all cards. Then, each card is respectively identified and provided with a distinct Relative Card Address (RCA) for the subsequent card addressing and data transfer. In the preferred embodiment, once one card is identified, data can begin to be transferred between the identified card in the DAT line while the remaining un-identified card(s) is still being identified. It should be noted that all data communications during the Card Identification Mode use the command line (CMD) only.

1. Voltage Negotiation

One aspect of the present invention is the ability to negotiate a common operating voltage range for operating different MultiMediaCard cards in the system.

In the present invention, the MultiMediaCard is preset to handle a maximum voltage range for communications between the host and the cards. However, because of different MultiMediaCard card manufacturers and/or technologies, each of the MultiMediaCard cards might support a different minimum and maximum operating voltage values. Thus each MultiMediaCard might only be able to operate in its corresponding VDD conditions. For example, in a MultiMediaCard system having two cards (e.g. M1 and M2), the first card (i.e. M1) supports an operating voltage of 1.5–2.5 volts, whereas the second card (i.e. M2) supports another operating voltage of 1.7–2.7 volts. These voltage values of each MultiMediaCard cards are defined in the card's OCR register and may not cover the entire operating range. This means that if the host and card have non compatible VDD ranges, the card will not be able to complete the identification cycle, nor to send CSD data.

Therefore, a voltage negotiation method between the host and all the MultiMediaCard cards is disclosed in the present invention. By issuing a special command SEND_OP_COND (CMD1) by the host to the MultiMediaCard cards, each of the MultiMediaCard card is requested to provide its voltage information to the host. The host then will determine a common operating voltage of all the MultiMediaCard cards. The voltage negotiation process begins with the host issuing the SEND_OP_COND command to the cards. By omitting the voltage range in this command, the host can query the card stack and request each card to provide with its operating voltage range. The host then determines the common voltage range by exclusive AND with all these voltage ranges provided by the cards. After the common voltage range is determined, the host will then only communicate with all the cards within this common voltage range. When a card is not designed to work within this common voltage range, the host will send this out-of-range cards into the Inactive State. This bus query should be used if the host is able to select a common voltage range or if a notification to the application of non usable cards in the stack is desired. Afterwards, the host must choose a common voltage for operation and reissue CMD1 with this condition, sending incompatible cards into the Inactive State.

For example, assuming that there are two cards (i.e. M1, and M2) connecting to the host. The corresponding OCR registers representing the two independent operating voltage ranges (e.g. M1: 2.2–3.0 V; M2: 2.5–3.4 V) are determined as follows (see FIG. 15):

| | |
|---|---|
| M1: | 00000000 00111111 11000000 00000000 |
| M2: | 00000000 00000111 11111100 00000000 |
| Wired-AND: | 00000000 00000111 11000000 00000000 |

Therefore, by wiring AND the OCR values provided by the two cards, the host can determine the common operating voltage range for accommodating both two cards. In the present case, the common voltage is between 2.5 to 3.0 V.

If a common operating voltage cannot be determined, the host will then reject cards that do not match the common operating voltage range desired by the host. In this case, the common operating voltage range can be any values preset in the host. For example, in the abovementioned example of M1 and M2, the common operating voltage will then be set as 1.7–2.5 volts.

After a common operating voltage is determined by the host, the host sends the determined VDD voltage window as an operand of the command SEND_OP_COND (CMD1). In response to this command, each of the active cards will define its OCR register value according to this voltage.

2. Identify Cards

Another aspect of the present invention is a method of identifying different cards in the system and assigning a distinctive RCA to each card accordingly. In the preferred embodiment of the present invention, the host initiates a card identification process to determine the characteristic of each card connected to the host. During the initiation, a MultiMediaCard address is assigned to each card for the communication between the card and the host system. Each of the input of the host starts the identification process in open-drain mode with the identification clock rate set to $f_{OD}$. The open drain driver stages on the CMD line of the MultiMediaCard cards allow parallel card operation during card identification.

Figure 30:
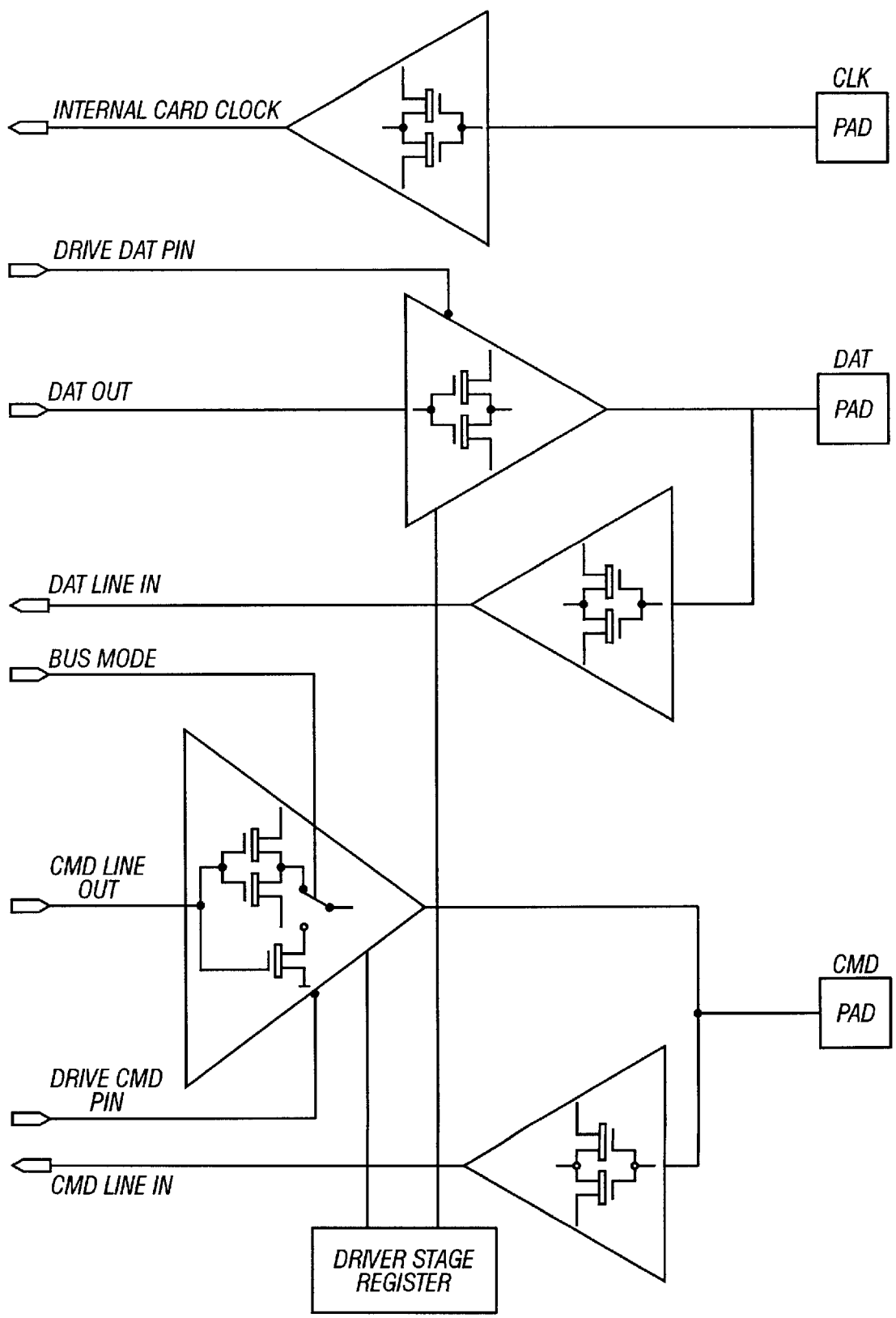
FIG. 30 shows a MultiMediaCard bus driver located in each of the MultiMediaCard cards of a preferred embodiment according to the present invention.

FIG. 30 shows a MultiMediaCard bus driver located in each of the MultiMediaCard cards. It should be pointed out that the CMD line of the present invention is divided into two components: One for the CMD line in, and the other for the CMD line out.

For the CMD line in, a simple push pull circuitry is employed.

For the CMD line out, a Bus mode selection input is provided to the output driver for selecting the mode of the CMD line out driver. When the CMD line out driver is used for data transfer, a first mode of a push pull driver is selected. On the other hand, during voltage negotiation and identification mode, an open drain (or collector) design is employed. The uses of open drain collector in each CMD line out driver for each MultiMediaCard card facilitate the wired AND operations used in the voltage negotiation and card identification as discussed in the previous paragraphs. The detailed operations of one embodiment of the dual mode selection of the CMD line out driver is disclosed in the PCT Pat. No. WO 97/38370 issued to Sotek, et al., titled "COMMUNICATIONS SYSTEM WITH A MASTER STATION AND AT LEAST ONE SLAVE STATION", and is hereby incorporated entirety by reference.

Specifically, after the bus is activated, the host will request the cards to send their valid operation conditions (CMD1). The responses to the command CMD1 from all the cards in the system are then "wired ANDed" together to determine the condition restrictions of all cards. Incompatible cards are sent into Inactive State.

The host then issues a broadcast command ALL_SEND_CID (CMD2), asking all cards for their unique card identification (CID) number. All unidentified cards (i.e. those which are in Ready State) simultaneously start sending their CID numbers serially, while bit-wise monitoring their outgoing bitstream. Those cards, whose outgoing CID bits do not match the corresponding bits on the command line in any one of the bit periods, stop sending their CID immediately and must wait for the next identification cycle (remaining in the Ready State). Since CID numbers are unique for each MultiMediaCard card, there should be only one card which successfully sends it full CID-number to the host. This card then goes into Identification State.

Thereafter, the host issues a SET_RELATIVE_ADDR command CMD3 to assign a relative card address (RCA) to this card. This RCA is normally shorter than the CID and will be used by the host to address the card in the future data transfer mode (typically with a higher clock rate than $f_{OD}$) Once the RCA is received, the card changes its state to the Stand-by State so that the card will not respond to further identification cycles. Furthermore, the card switches its output drivers from open-drain to push-pull.

After a card is recognized and assigned with a RCA, the host repeats this identification process to the remaining unrecognized cards, i.e. the cycles with the commands CMD2 and CMD3 as long as it receives a response (CID) to its identification command (CMD2). Finally, if there is not any more card responding to this command, all cards have been identified. In the preferred embodiment, the time-out condition to recognize completion of the identification process is the absence of a start bit for more than NID clock cycles after sending the command CMD2.

3. Power Up

In the preferred embodiment of the present invention, the power up of the MultiMediaCard bus is handled locally in each MultiMediaCard card and in the bus master of the host After powering up the card (including hot insertion, i.e. inserting a card when the bus is operating), the MultiMediaCard card first enters an idle state. When a MultiMediaCard card is in the idle state, this card ignores all bus transactions until the command CMD1 is received from the MultiMediaCard host.

The CMD1 command is a special synchronization command used by the MultiMediaCard host to negotiate the operating voltage range and to poll the cards until they are out of their power-up sequence. Besides the operation voltage profile of the cards, the response to CMD1 contains a busy flag. By responding with a busy flag, the MultiMediaCard card indicates that it is still working on its power-up procedure and is not ready for identification. This bit informs the host that at least one card is not ready. The host has to wait (and continue to poll the cards) until this bit is cleared.

In the preferred embodiment, the bus master of the host is responsible for getting the whole MultiMediaCard system, including the host and all the cards, out of idle state. Since the power up time and the supply ramp up time depend on various application parameters such as maximum number of MultiMediaCards, bus length and power supply unit, the host must ensure that the power is built up to the operating level (the same level which will be specified in CMD1) before the command CMD1 is transmitted.

After the power up procedure is completed, the host starts the clock and sends an initialization sequence on the CMD line. In the preferred embodiment of the present invention, this sequence is a contiguous stream of logical '1's. The sequence length is the maximum of 1 ms, 74 clocks or the supply rampup time. The additional 10 clocks (over the 64 clocks after what the card should be ready for communication) is provided to eliminate power-up synchronization problems.

In the preferred embodiment of the present invention, every bus master is required to implement the command CMD1 protocol. However, the implementation is optional for the MultiMediaCard cards because cards which support the entire maximum voltage range of the MultiMediaCard bus, and are guaranteed to be ready for identification within 64 clocks from power up may ignore this command. In fact, the cards which do not support the command CMD1 will change into the ready state as soon as their power up sequence has been finished.

4. Reset

In the preferred embodiment of the present invention, the busy bit in responding to the command CMD1 can be used by a card to inform the host that it is still working on its power-up/reset procedure (e.g. downloading the register information from memory field) and is not ready yet for communication. In this case the host must repeat the command CMD1 until the busy bit is cleared.

5. Inactive

In the preferred embodiment of the present invention, during the initialization procedure, the host is not allowed to change the operation voltage range. Such change will be ignored by the card. If the operation conditions change, the host must reset the card stack (using the command CMD0) and restart the initialization procedure. However, for accessing the cards already in the Inactive State, a hard reset must be done by switching the power supply off and on.

The command GO_INACTIVE_STATE (CMD15) can be used to send an addressed card into the Inactive State. This command is used when the host explicitly wants to deactivate a card (e.g. host is changing Vdd into a range which is known to be not supported by this card).

C. Data Transfer State

In the preferred embodiment of the present invention, all cards in the stand-by state are communicated over the CMD and DAT lines in push-pull mode. Until the contents of all CSD registers are transferred and known by the host, the $f_{pp}$ clock rate must remain at $f_{OD}$ because some cards may have operating frequency restrictions. Therefore, the host issues the SEND_CSD command (CMD9) to obtain the card Specific Data from its CSD register, e.g. block length, card storage capacity, and maximum clock rate, etc.

1. Card Configuration

In one preferred embodiment, the MultiMediaCard system has an option to configure the driver stages of all identified cards. Therefore, to begin with data transfer, the host first issues a broadcast command SET_DSR (CMD4) to configure the driver stages of all identified cards. The SET_DSR command (CMD4) programs all the DSR registers according to the application bus layout (length) and the number of cards on the bus and the data transfer frequency. The clock rate is also switched from $f_{OD}$ to $f_{pp}$ by this command.

2. Card Selected

To initiate the data transfer, the host issues an addressed command CMD7 to select one of the cards. The selected card is then put into the Transfer State. It should be noted that only one card can be selected to be in the Transfer State at a given time because the DAT bus is temporarily occupied solely for the communications between the specific card and the host. If there is a selected card being in the Transfer State when the command is issued, the previous selected card will be deselected and disconnected from the host. The disconnected card will return to the Stand-by State.

It should be pointed out that all data communication in the Data Transfer Mode is point-to-point between the host and the selected card (using addressed commands). As discussed before, all addressed commands will receive a response from the addressed card from the CMD line.

3. Buffering p In another preferred embodiment of the present invention, the card is able to provide data buffering for stream and block write. This means that the next block can be sent to the card while the previous is being written to the card.

If all write buffers are full, and as long as the card is in Programming State, the DAT line will be kept low.

However, in the preferred embodiment, there is no buffering option for the following requests: write CSD, write CID, write protection and erase. When the card is busy servicing any one of these commands, the card will not accept any other data transfer commands. During this state, the DAT line will be kept low as long as the card is busy and in the Programming State.

Furthermore, in the preferred embodiment of the present invention, parameter set commands are not allowed when the card is being written.

In the preferred embodiment, parameter set commands are: set block length (CMD16), and erase tagging/untagging (CMD32–37).

Similarly, read commands are not allowed when the card is being written.

The host can reselect a card while the card is in the Disconnect State using the command CMD7. By selecting this card, the card will move from the disconnect state back to the Programming State. Furthermore, the card will reactivate the busy indication.

The commands CMD0 and CMD15 are for resetting a card. However, resetting a card will terminate any pending or active programming operation so that the data contents inside the card will be discarded.

4. Data Read

In the preferred embodiment of the present invention, the DAT bus line is maintained high when data is not being transmitted. A transmitted data block consists of a start bit (LOW), followed by a continuous data stream. The data stream contains the payload data (and error correction bits if an off-card ECC is used) and ends with an end bit (HIGH).

a. Stream Read

In addition, the present MultiMediaCard system allows a stream oriented data transfer. The stream oriented data transferred is controlled by a READ_DAT_UNTIL_STOP command (i.e. CMD11). This addressed command instructs the selected card to send its payload, starting at a specific address, until the host sends a STOP_TRANSMISSION command (i.e. CMD12). The stop command (CMD12) has an execution delay due to the serial command transmission. Therefore, the data transfer stops after the end bit of the stop command.

The maximum clock frequency for stream read operation is given by the following formula:

A specific block length is defined in the CSD (READ_BL_LEN=<value>)

$$\text{max.speed=min ((TRAN\_SPEED), (READ\_BL\_LEN/(NSAC+TAAC))}$$

Any block length allowed in the CSD (READ_BL_LEN='any')

$$\text{Max.speed =TRAN\_SPEED}$$

If the host attempts to use a higher frequency, the card may not be able to sustain the data transfer. If a unsustained frequency is used, the card will set the UNDERRUN error bit in the status register, abort the transmission and wait in the data state for a stop command.

b. Block Read

In addition, the preferred embodiment of the present invention also allows a block read command. The block read command is similar to the stream read as discussed above, except that the basic unit of data transfer is a block. The maximum block size is defined in the READ_BL_LEN field in the CSD register. If the READ_BL_PARTIAL field is set, smaller blocks whose starting and ending addresses are entirely contained within one physical block (as defined by READ_BL_LEN) may also be transmitted. Unlike the stream read command, a CRC is appended to the end of each block ensuring data transfer integrity.

In the preferred embodiment, the READ_SINGLE_BLOCK command (i.e. CMD17) initiates a block read. After completing a block transfer, the card returns to the Transfer State. On the other hand, the READ_MULTIPLE_BLOCK command (i.e. CMD18) starts a transfer of several consecutive blocks. In this case, blocks of data will be continuously transferred until a stop command is issued.

If the host uses partial blocks whose accumulated length is not block aligned and block misalignment is not allowed, the card will indicate a block misalignment at the beginning of the first misaligned block. The card will set the ADDRESS_ERROR error bit in the status register, and then abort the data transmission and wait in the Data State for a stop command.

5. Data Write

In the preferred embodiment, the protocol of writing data to the card is similar to the data read protocol. However, for block oriented write data transfer, the CRC check bits are added to each data block. The card performs a CRC parity check for each received data block prior to the write operation. By using the CRC mechanism, writing of erroneously transferred data can be prevented.

a. Stream Write

Similar to the stream read command of the preferred embodiment as discussed, the stream write command (i.e. CMD20) provides a starting address to the card. Then the host begins transferring data to the card beginning with the starting address until the host issues a stop command to terminate the data transfer. If partial blocks are allowed (if CSD parameter (WRITE_BL_PARTIAL is set), the data stream can start and stop at any address within the card address space. Otherwise the data transfer starts and stops only at block boundaries. Since the amount of data to be transferred is not determined in advance, CRC cannot be used. If the end of the memory range is reached when data is still being sent and no stop command has been received by the card, all further transferred data will be discarded.

Similarly, the maximum clock frequency for stream write operation is given by the following formula:

A specific block length is defined in the CSD (WRITE_BL_LEN=<value>)

$$\text{max.speed=min ((TRAN\_SPEED), ((WRITE\_BL\_LEN/(NSAC+TAAC))/SW\_FACTOR)}$$

Any block length allowed in the CSD (WRITE_BL_LEN='any')

$$\text{Max.speed=TRAN\_SPEED/SW\_FACTOR}$$

If the host attempts to use a higher frequency, the card may not be able to process the data and the data writing will be stopped. Then the OVERRUN error bit in the status register will be set, and all further data transfer will be ignored while waiting (in the Receive-data-State) for a stop command. The write operation will also be terminated if the host tries to write over a write protected area. In the present invention, the card shall set the WP_VIOLATION bit.

b. Block Write

The block write commands (i.e. CMDs 24 to 27) are similar in operation to the block read commands as discussed. For the block write commands, one or more blocks of data are transferred from the host to the card. In the preferred embodiment of the present invention, a CRC is appended to the end of each block by the host. Furthermore, a card supporting block write can always accept a block of data which length is defined by the WRITE_BL_LEN field. If the CRC fails, the card will indicate the failure on the DAT line and the transferred data will be discarded and not written. Finally, in multiple block write mode, all further transmitted blocks will be ignored by the card.

If the host uses partial blocks whose accumulated length is not block aligned and block misalignment is not allowed (i.e. CSD parameter WRITE_BLK_MISALIGN is not set), the card will signal a block misalignment error and abort the data writing before the beginning of the first misaligned block. The card will then set the ADDRESS_ERROR error bit in the status register. All further data transfer will be ignored, and the host will wait in the Receive-data-State for a stop command.

Similarly, the write operation will also be aborted if the host tries to write over a write protected area. In this case, however, the card will set the WP_VIOLATION bit in the CRC register.

c. Programming the CID and CSD Registers

In the preferred embodiment of the present invention, the process of programming the CID and CSD registers does not require a previous block length setting. In addition, the transferred data is also CRC protected. If any of part of the CSD or CID register is already stored in the ROM, the portion of the register will be overwritten. For the CID register, it should be noted that the card will not verify whether the ROM data is consistent with the data received. In the preferred embodiment, the CID register cannot be written at all. The data is written only once during manufacturing and cannot be overwritten afterward. On the other hand, for the CSD register, the received data will be verified with the ROM data.

In some instances, a card may require long and unpredictable times to write a block of data. Therefore, after receiving a block of data and completing the CRC check, the card will begin writing and hold the DAT line low if its write buffer is full and unable to accept new data from a new WRITE_BLOCK command. While waiting for the data writing to complete, the host may simultaneously poll the status of the card with a SEND_STATUS command (i.e. CMD 13) at any time using the CMD line. After receiving this command, the card will respond to the host request with its status using the CMD line. The status bit READY_FOR_DATA of the status register indicates whether the card can accept new data or whether the write process is still in progress. If the host desires to terminate the ongoing process of sending data to one card and begin transferring data to another card in the MultiMediaCard system, the host can deselect the card by issuing a CMD7 command (to select a different card). The newly selected card will displace the previous selected card. The deselected card will move into a disconnect state and release the DAT line without interrupting the write operation. However, the deselected card can be reselected again if needed. By reselecting the card, the reselected card will reactivate the busy indication by pulling DAT to low if the data writing is still in progress and the write buffer is unavailable.

d. Timing Diagrams (I) Single Block Write

In the preferred embodiment of the present invention, the host first selects one card for data write operation by the command CMD7. Then the host sets the valid block length for block oriented transfer (a stream write mode is also available) by command CMD16.

Figure 31:
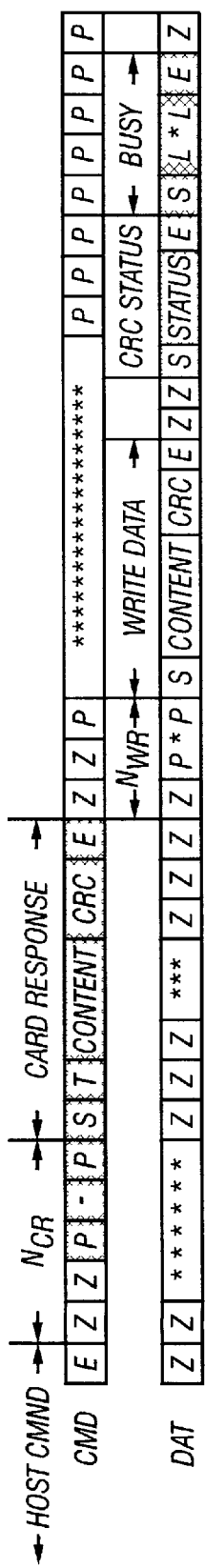
FIG. 31 shows a timing diagram for a block write command of a preferred embodiment according to the present invention.

FIG. 31 shows a timing diagram for a write command of a preferred embodiment according to the present invention. As shown in the figure, the write sequence starts with a single block write command (i.e. CMD24) which determines (in the argument field) the start address. The card responds on the CMD line as usual. The data transfer from the host starts the $N_{WR}$ clock cycles after the card response was received.

In the preferred embodiment as shown, the data is suffixed with CRC check bits to allow the card to check for transmission errors. The card returns the CRC check result as a CRC status token on the data line. In the case of transmission error, the card sends a negative CRC status ('101'). In the case of non erroneous transmission, the card sends a positive CRC status ('010') and starts the data writing procedure.

If the card does not have a free data receive buffer when a block write command is received, the card will indicate this condition by pulling down the data line to LOW. The data line will remain LOW until at least one receive buffer for the defined data transfer block length becomes free. However, this signaling does not provide the host with any information about the data write status. The host must poll the card for requesting this information.

(ii) Multiple Block Write

Figure 32:
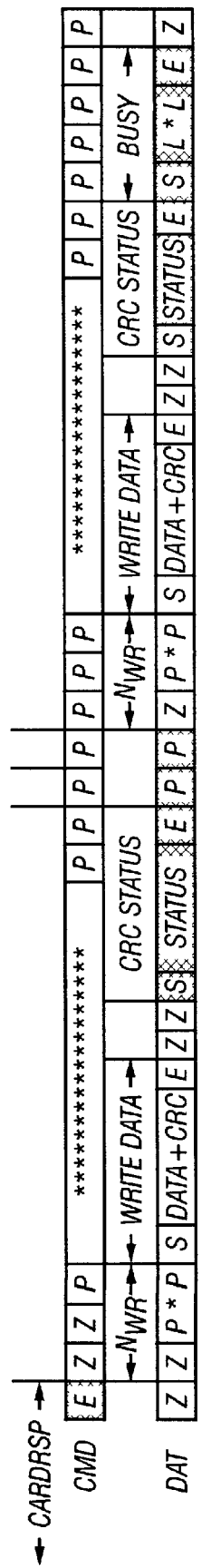
FIG. 32 shows a timing diagram for a multiple block write command of a preferred embodiment according to the present invention.

In the multiple block write mode, the card expects continuous flow of data blocks following the initial host write command. The data flow is only terminated by a stop transmission command (CMD12) issued by the host. FIG. 32 shows a timing diagram of a multiple block write command of a preferred embodiment according to the present invention. As shown in the figure, when the card is not busy, the CRC status token will be followed by two push bits before the bus direction is switched to the (card) input direction for the next block.

(iii) Stop Command

FIGS. 33–36 are different timing diagrams showing the use of the stop command during different card states.

It should be noted that, in the preferred embodiment of the present invention, the host will treat a data block as successfully received by the card only if the CRC data of the block was validated and the CRC status token sent back to the host.

Figure 33:
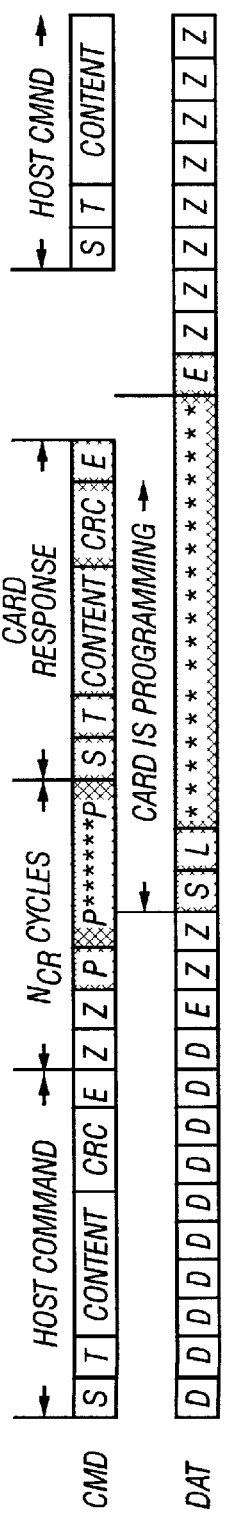
FIG. 33 shows a timing diagram for a stop transmission command issued during the data transfer from a host of a preferred embodiment according to the present invention.

FIG. 33 shows a timing diagram for a stop transmission command issued during data transfer from a host of a preferred embodiment according to the present invention.

FIG. 34 shows a timing diagram for a stop transmission command issued during the transmission of the CRC status block of the preferred embodiment according to the present invention. The sequence is identical to all other stop transmission examples. The end bit of the host command is followed, on the data line, with one more data bit, end bit and two Z clock for switching the bus direction. Therefore, the received data block is considered incomplete and will not be written into the card.

FIGS. 35–36 describe two scenarios of receiving the stop transmission command between data blocks transfer. In the first example as shown in FIG. 35, the card is busy in writing the last data block when the stop command is received. In the second example as shown in FIG. 36, the card is idle when the stop command is received. Since there are still unprogrammed data blocks in the input buffers, the card then continues the data writing as soon as the stop transmission command is received. In this case, the host then activates the busy signal.

(iv) Sequential Write

In order to handle the sequential write command of the present invention, the data transfer starts $N_{WR}$ clock cycles after the card response to the sequential write command was received. The bus transaction is identical to that of a write block command (see FIG. 31). As the data transfer is not block oriented, the data stream will not include the CRC checksum. Consequently the host cannot receive any CRC status information from the card. Similarly, the data stream can be terminated by a stop command. The bus transaction is identical to the write block option when a data block is interrupted by the stop command (see FIG. 33).

III. DETAILED COMMAND DESCRIPTIONS

A. Commands

In the preferred embodiment of the present invention, there are four types of commands defined to control the MultiMediaCard system:

1. Broadcast commands (bc): This type of commands is issued to all the MultiMediaCard cards by the host. No response is required from the MultiMediaCard cards.
2. Broadcast commands with response (bcr): This type of commands is issued to all the MultiMediaCard cards by the host. Simultaneously responses in the command bus from all cards are required. The host will sort out the sequences of the responses.
3. Addressed (point-to-point) commands (ac): This type of commands is issued by the host to a specific MultiMediaCard card identified by the attached address. Responses in the command bus from the addressed card is optional.
4. Addressed (point-to-point) data transfer commands (adtc): This type of commands is issued by the host to a specific MultiMediaCard card indicated by an address attached to the command. When the specific MultiMediaCard card receives the command, the DAT bus will be occupied by the addressed MultiMediaCard card for data transfer between the selected card and the host. In this case, no other MultiMediaCard card can access the data bus until a deselected command is issued by the host or the data transmission is completed.

It should be noted that, in the preferred embodiment of the present invention, all commands and responses are communicated over the CMD bus. In the preferred embodiment, the DAT bus is used solely for data transfer so that the CMD bus can be used for communications between the host and the cards while data is being transferred in the DAT bus.

FIG. 37 shows a table illustrating different command classes of a preferred embodiment according to the present invention. The command set of the MultiMediaCard system as shown is divided into several classes (i.e. classes 0–11).

In the preferred embodiment as shown, class 0 is mandatory and is supported by all MultiMediaCard cards. The other classes are optional and can be interpreted as a tool box. By using different classes, several configurations can be chosen (e.g. a block writeable card or a stream readable card). The supported Card Command Classes (CCC) are coded as a parameter in the card specific data (CSD) register of each card, providing the host with information on how to access the card.

FIGS. 38–44 show detail descriptions of all the MultiMediaCard bus commands of a preferred embodiment according to the present invention.

B. Responses

In the preferred embodiment of the present invention, all responses are sent via the command line CMD. By using only the command line, the response will not interrupt any data transferred currently utilizing the DAT bus. This feature of the present invention provide the MultiMediaCard system the ability to maintain the communications (i.e. commands and responses) while allowing data being transferred between the host and the cards through the use of the DAT bus.

In the preferred embodiment of the present invention, a response always starts with a start bit (always '0'), and followed by the bit indicating the direction of transmission (card='0'). A value denoted by 'x' in the tables below indicates a variable entry. All responses except for the type R3 (see below) are protected by a CRC. Every command codeword is terminated by the end bit (always '1').

In the preferred embodiment according to the present invention, there are five types of responses. Each of these responses can be sent through the command bus while the data bus is occupied for data transfer. Their formats are defined as follows:

1. R1 (normal response command): code length 48 bits. Bits 45:40 indicate the index of the command to be responded to, this value being interpreted as abinary coded number (between 0 and 63). The status of the card is coded in 32 bits (bits 39:8). FIG. 45 shows a detail description of the format of this response.

R1b is identical with R1, but additional busy signaling via the data channel.

2. R2 (CID, CSD register): code length 136 bits. The contents of the CID register are sent as a response to the commands CMD2 and CMD10. The contents of the CSD register are sent as a response to CMD9. Only the bits [127 . . . 1] of the CID and CSD are transferred, the reserved bit [0] of these registers is replaced by the end bit of the response. FIG. 46 shows a detail description of the format of this response.

3. R3 (OCR register): code length 48 bits. The contents of the OCR register is sent as a response to CMD1. The level coding is as follows: restricted voltage windows= LOW, card busy=LOW. FIG. 47 shows a detail description of the format of this response.

4. R4 (Fast I/O): code length 48 bits. The argument field contains the RCA of the addressed card, the register address to be read out or written to, and its contents. FIG. 48 shows a detail description of the format of this response.

5. R5 (Interrupt request): code length 48 bits. If the response is generated by the host, the RCA field in the argument shall be 0x0. FIG. 49 shows a detail description of the format of this response.

C. Card Status

The response format R1 contains a 32-bit field indicating the status of the card. This field is intended to transmit the card's status information (which may be stored in a local status register) to the host. If the field is not specified otherwise, the status entries are always related to the previous issued command. The semantics of this register is according to the CSD entry MMC_PROT, indicating the version of the response formats.

FIG. 50 is a detail description of a response showing the status of a card of the preferred embodiment according to the present invention. For the response type: E is an error bit; S is a status bit; R is detected and set for the actual command response; and X is detected and set during command execution. Particularly, the host must poll the card by issuing the status command in order to read these bits. For the clear condition: A means according to the card current state; B is always related to the previous command, reception of a valid command will clear it (with a delay of one command); and C means clear by read.

D. Timings

FIG. 51 is a table showing all the timing diagram symbols used in a preferred embodiment according to the present invention. The difference between the P-bit and Z-bit is that a P-bit is actively driven to HIGH by the card respectively host outport driver, while Z-bit is driven to (respectively kept) HIGH by the pull-up resistors RCMD respectively RDAT. Actively driven P-bits are less sensitive to noise.

FIG. 52 shows a timing diagram for a command and a response operating in the identification mode of the preferred embodiment according to the present invention. In this preferred embodiment, both host command and card response are clocked out with the rising edge of the host clock. The minimum delay between the host command and card response is NcR clock cycles. This particular timing diagram is relevant for host command CMD 3.

FIG. 53 shows a timing diagram for a command and a response operating in the data transfer mode of the preferred embodiment. In this embodiment, there is just one Z bit period followed by P bits pushed up by the responding card. This particular timing diagram is relevant for all responded host commands except CMD 1,2,3.

Figure 54:
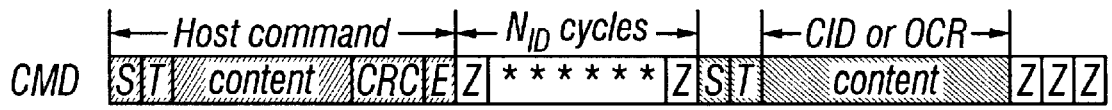
FIG. 54 shows a timing diagram for a command and an identification response operating in the identification mode of a preferred embodiment according to the present invention.

FIG. 54 shows a timing diagram for a command and an identification response operating in the card identification mode of the preferred embodiment according to the present invention. In this embodiment, the card identification command (CMD2) and card operation conditions command (CMD1) are processed in the open-drain mode. The card response to the host command starts after exactly NID clock cycles.

Figure 55:
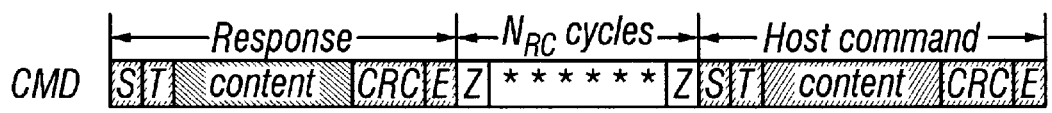
FIG. 55 shows a timing diagram for a response and a next new command operating in the data transfer mode of a preferred embodiment according to the present invention.

FIG. 55 shows a timing diagram for a response and a next new command operating in the data transfer mode of the preferred embodiment according to the present invention. In this embodiment, after receiving the last card response, the host can start the next command transmission after at least $N_{RC}$ clock cycles. This particular timing diagram is relevant to any host command.

Figure 56:
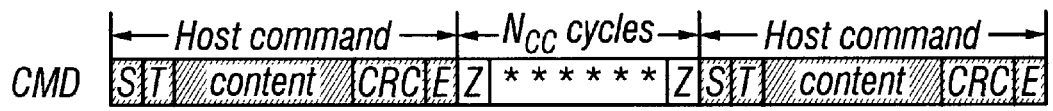
FIG. 56 shows a timing diagram showing two consecutive commands in any operating modes of the preferred embodiment according to the present invention.

FIG. 56 shows a timing diagram showing two consecutive commands in any operating modes of the preferred embodiment according to the present invention. This diagram shows that, after the last command has been sent, the host can continue sending the next command after at least $N_{CC}$ clock periods.

Figure 57:
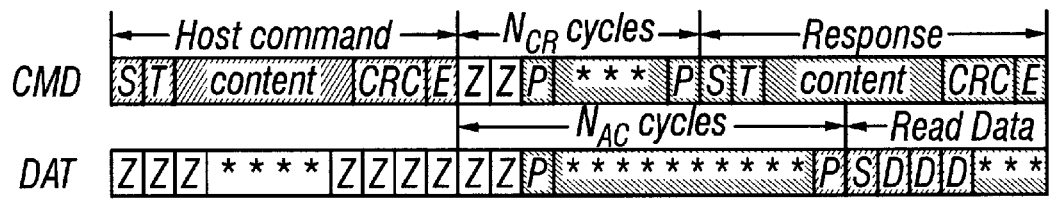
FIG. 57 shows a timing diagram for a command and data read from a card of a preferred embodiment according to the present invention.

FIG. 57 shows a timing diagram for a command and data read from a card of the preferred embodiment according to the present invention. The timing diagram shows that the data transmission starts with an access time delay $t_{AC}$ (corresponds to $N_{AC}$), beginning from the end bit of the data address command. The data transfer stops automatically in the case of a data block transfer or by a transfer stop command.

Figure 58:
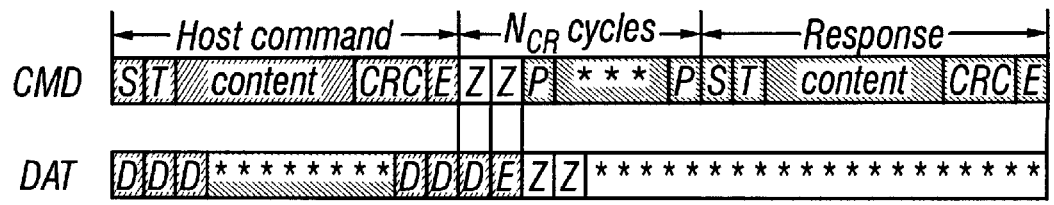
FIG. 58 shows a timing diagram for a regular command and a stop command in the data transfer of a preferred embodiment according to the present invention.

FIG. 58 shows a timing diagram for a regular command and a stop command CMD12 in the data transfer mode of the preferred embodiment according to the present invention. The timing diagram shows that the data transmission can be stopped using the stop command. Specifically, the data transmission stops two clock cycles after the end bit of the stop command.

Figure 59:
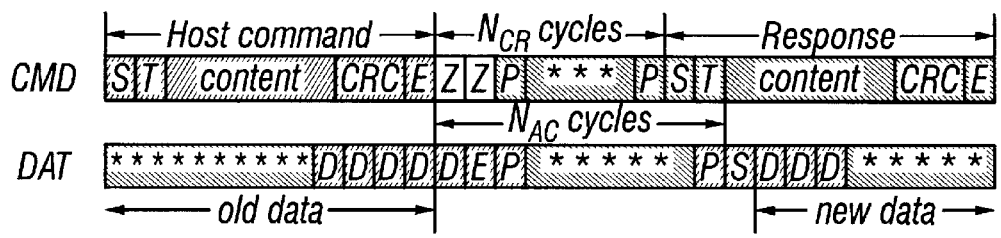
FIG. 59 shows a timing diagram for a next data block transfer of the preferred embodiment according to the present invention.

FIG. 59 shows a timing diagram for a next data block transfer of the preferred embodiment according to the present invention. The timing diagram shows that the data transmission stops immediately with the end bit of the host command. Then the next data block transmission starts after an access time delay $t_{AC}$, beginning from the end bit of the data address command.

Figure 60:
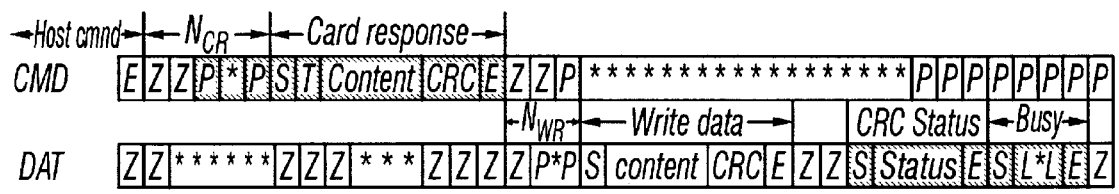
FIG. 60 shows a timing diagram for a command and a response of a single block write command of a preferred embodiment according to the present invention.

FIG. 60 shows a timing diagram for a command and a response of a single block write command of the preferred embodiment according to the present invention. First, the host selects one card for the data write operation by the command CMD7. Then, the host sets the valid block length for block oriented transfer (a stream write mode is also available) by the command CMD 16.

As shown in FIG. 60, the block write command sequence starts with a single block write command (CMD24) which determines (in the argument field) the starting address. The command is responded by the card on the CMD line as usual. Then the data transfer from the host starts $N_{WR}$ clock cycles after the response from the addressed card was received.

In the preferred embodiment as shown, the data is suffixed with CRC check bits to allow the card to check it for transmission errors. In respond to the CRC check bits, the card sends back the CRC check result as a CRC status token on the data line. In the case of transmission error, the card returns a negative CRC status ('101'). On the other hand, in the case of non-erroneous transmission, the card sends a positive CRC status ('010') and starts the data programming procedure.

Furthermore, if the card does not have a free data receive buffer, the card will indicate this condition by pulling down the data line to LOW. As soon as at least one receive buffer for the defined data transfer block length becomes free, the card will stop pulling down the data line. However, this signaling does not give any information about the data write status which must be polled by the host.

Figure 61:
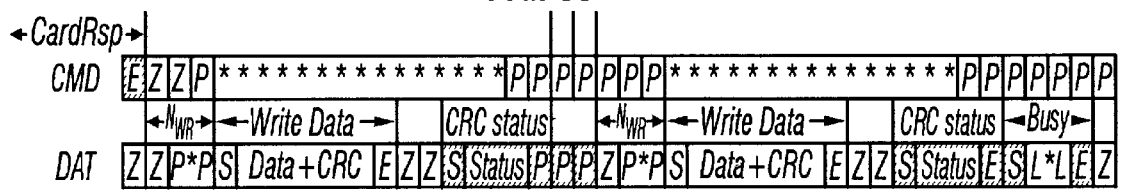
FIG. 61 shows a timing diagram for a command and a response of a multiple block write command of a preferred embodiment according to the present invention.

FIG. 61 shows a timing diagram for a command and a response of a multiple block write command of the preferred embodiment according to the present invention. In response to the multiple block write command, the card expects continuous flow of data blocks following the initial host write command. The data flow is only terminated by a stop transmission command (CMD12). The diagram describes the timing of the data blocks with and without card busy signal. When the card is not busy, the CRC status token will be followed by two push bits before the bus direction is switched to the (card) input direction for the next block.

Figure 62:
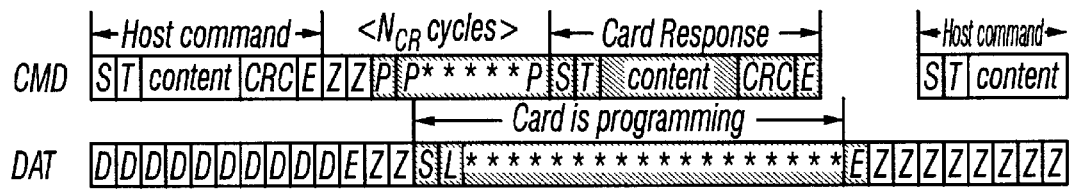
FIG. 62 shows a timing diagram for a write command and a stop command in the data transfer mode of a preferred embodiment according to the present invention.
Figure 63:
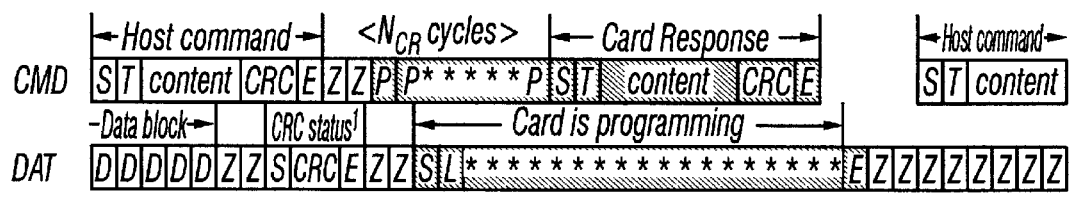
FIG. 63 shows a timing diagram for an interrupted stop request during CRC status transfer from a card of a preferred embodiment according to the present invention.
Figure 64:
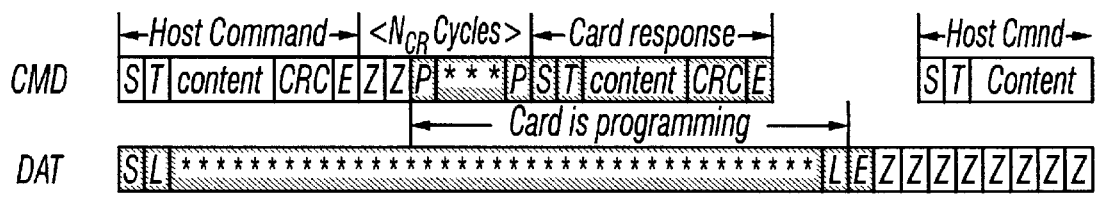
FIG. 64 shows a timing diagram for a stop transmission request received after a last data block transfer while the card is busy with programming of a preferred embodiment according to the present invention.

FIG. 62 to FIG. 64 show the timing of the stop command operating in different card states.

FIG. 62 shows a timing diagram for a write command and a stop command in the data transfer mode of the preferred embodiment according to the present invention. In this preferred embodiment, the card will treat a data block as successfully received and ready for programming only if the CRC data of the block is validated and the CRC status token sent back to the host.

FIG. 63 shows a timing diagram for an interrupted stop request during the CRC status transfer from a card of the preferred embodiment according to the present invention. The sequence is identical to all other stop transmission examples. The end bit of the host command is followed, on the data line, with one more data bit, end bit and two Z clock for switching the bus direction. The received data block, in this case is considered incomplete and will not be programmed.

Figure 65:
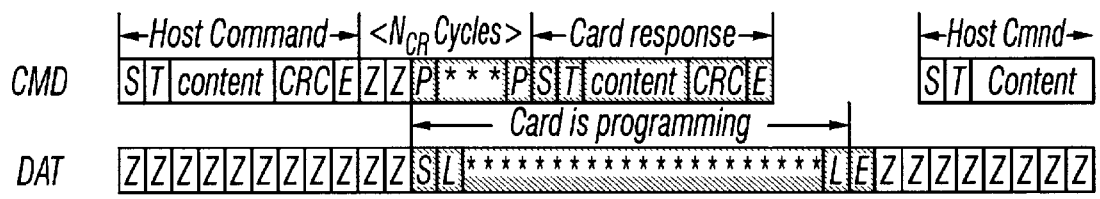
FIG. 65 shows a timing diagram for a stop transmission request received after a last data block transfer while the card is being idle of a preferred embodiment according to the present invention.
Figure 67:
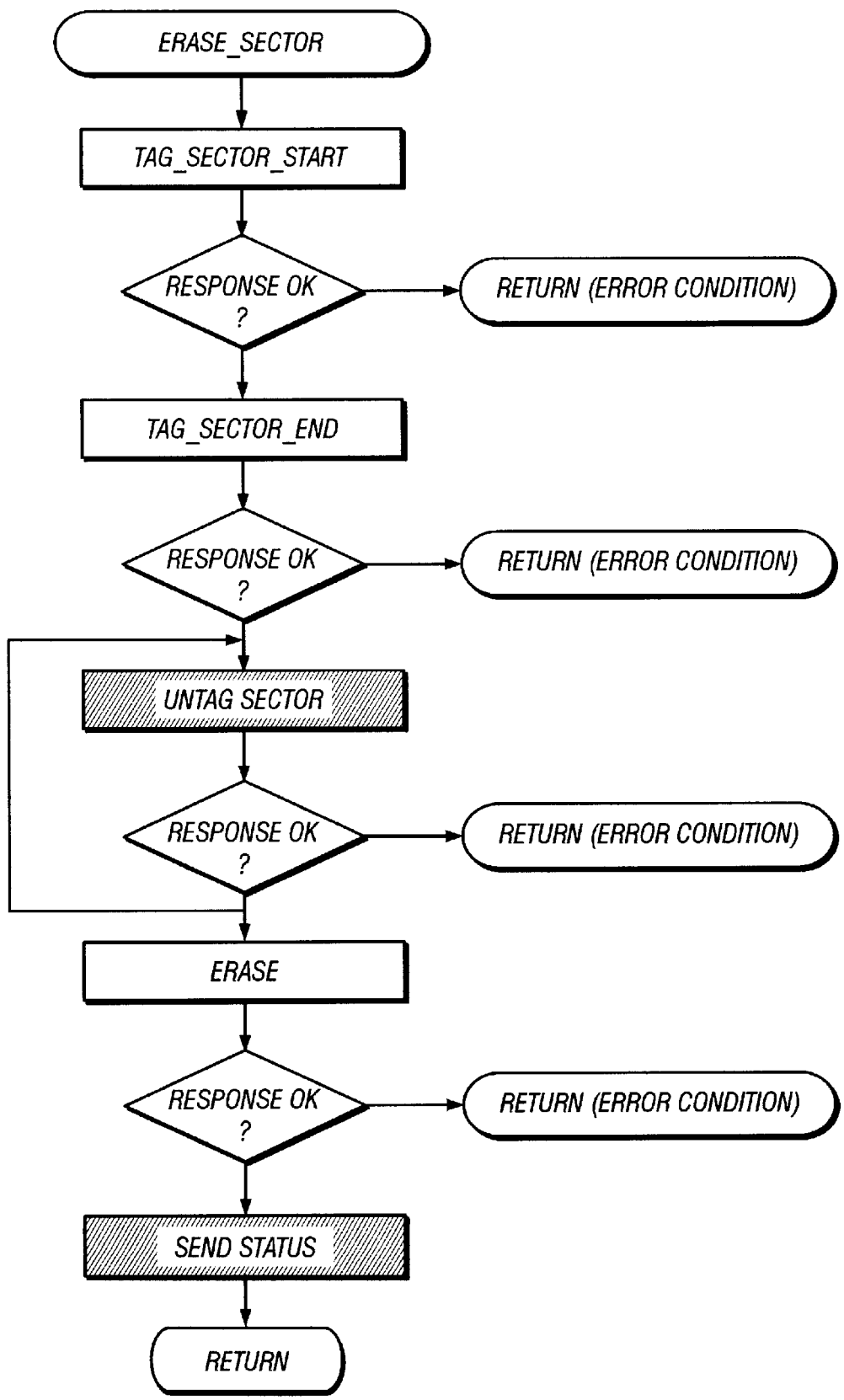
FIG. 67 shows a flow chart of the MultiMediaCard macro command CIM_ERASE_SECTOR of a preferred embodiment according to the present invention.

All previous examples dealt with the scenario of the host stopping the data transmission during an active data transfer. FIGS. 64–65 describe a scenario of receiving the stop transmission between data blocks. In the timing diagram as shown in FIG. 67, the card is busy programming the last block. On the other hand, in FIG. 68, the card is idle. However, there are still unprogrammed data blocks in the input buffers. These blocks are being programmed as soon as the stop transmission command is received and the card activates the busy signal.

When the host is performing Sequential write, the data transfer starts $N_{WR}$ clock cycles after the card response to the sequential write command was received. The bus transaction is identical to that of a write block command (see FIG. 60). As the data transfer is not block oriented, the data stream does not include the CRC checksum. Consequently the host cannot receive any CRC status information from the card. The data stream is terminated by a stop command. The bus transaction is identical to the write block option when a data block is interrupted by the stop command (see FIG. 62).

When the host of the MultiMediaCard system initiates an erase, set and clear write protect timing, the host must first tag the sectors to erase using the tag commands (CMD32–CMD37). The erase command (CMD38), once issued, will erase all tagged sectors. Similarly, set and clear write protect commands start a programming operation as well. The card will signal "busy" (by pulling the DAT line low for the duration of the erase or programming operation. The bus transaction timings are described in FIG. 65.

IV. ERASE

A. Memory Array Paritioning

In the preferred embodiment of the present invention, the basic unit of data transfer between the MultiMediaCard system is one byte. All data transfer operations which require a block size always define block lengths as integer multiples of bytes.

Figure 66:
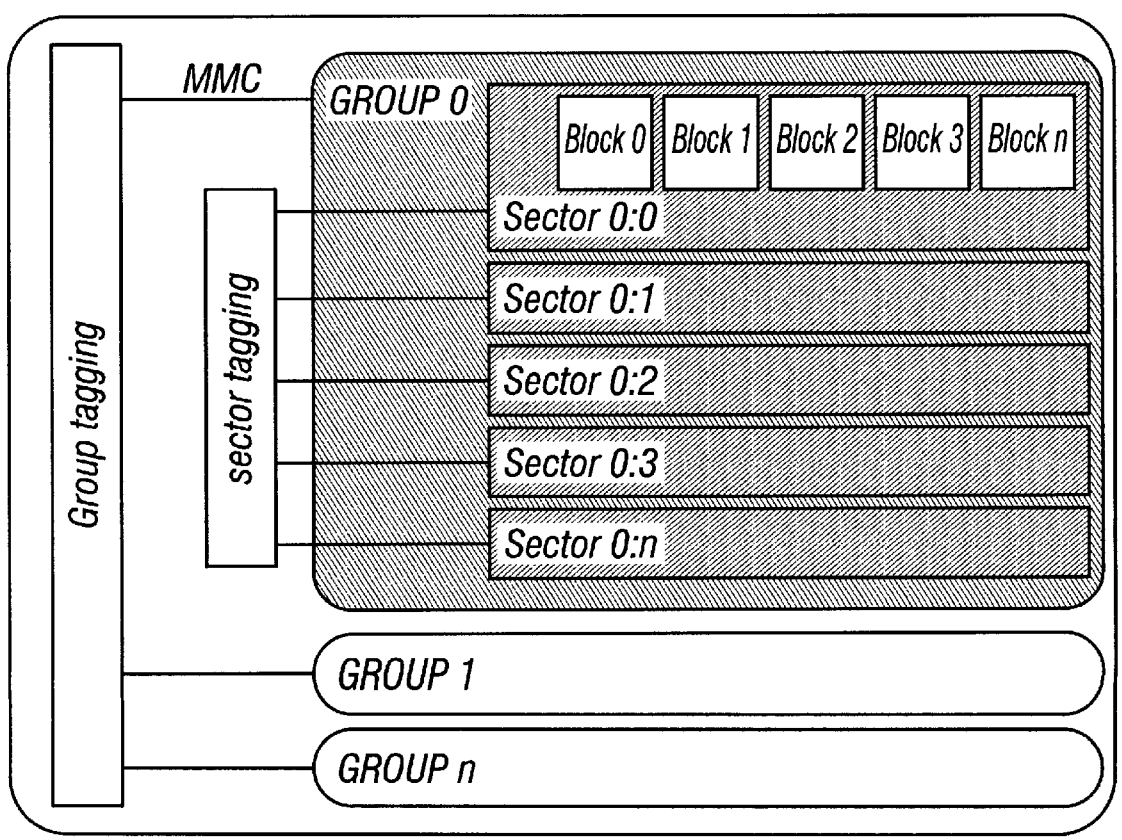
FIG. 66 shows the memory hierarchy of a MultiMediaCard card of a preferred embodiment according to the present invention.

As described in the previous paragraphs, some MultiMediaCard are designed as a memory storage. FIG. 66 shows a preferred embodiment of the memory hierarchy of a MultiMediaCard card used as a memory storage.

As shown in the figure, the MultiMediaCard card is divided into n memory groups. Each of the memory groups is subdivided into a plurality of sectors. Further, each of the sector comprises of a plurality of memory blocks. The detail definition of memory blocks, sectors and groups are described as follows:

Block is the unit which is related to the block oriented read and write commands. Its size is the number of bytes which will be transferred when one block command is sent by the host. It should be noted that the size of a block is either programmable or fixed. The information about allowed block sizes and the programmability is stored in the CSD.

Sector is the unit which is related to the erase commands. In the preferred embodiment as shown, the sector size is the number of blocks which will be erased in one portion. The size of a sector is fixed for each device. The information about the sector size (in blocks) is stored in the CSD.

In the preferred embodiment as shown, each group comprises a plurality of sectors. The group size is the number of consecutive sectors which can be erased at once. In the preferred embodiment, the group size is a configurable parameter and may be different for every card. The actual size is stored in the CSD register and the corresponding sectors of an erase group is calculated by firmware inside the card in real time.

It should be noted that U.S. Pat. No. 5,418,752 titled "FLASH EEPROM SYSTEM WITH ERASE SECTOR SELECT" issued to Harari et al. disclosed another method and apparatus of partitioning a memory, and the document is hereby incorporated by reference in its entirety.

B. Erase Tagging Hierarchy

Another aspect of the present invention is to provide the MultiMediaCard host the ability to erase (1) any combination of sectors in a single erase group; or (2) any combination of the entire erase groups.

The following example is for a MultiMediaCard card memory having 4 memory groups (e.g. A, B, C, and D), and each of the four memory groups having 5 sectors (e.g. 1, 2, 3, 4, and 5).

According to the preferred embodiment of the present invention, the card can be programmed so that the 3, 4, and 5 sectors of a specific group (i.e. A, B, C, or D) can be erased simultaneously by using one command. In addition, the card can also be programmed so that all sectors of groups A, and C are erased simultaneously by using one command. The ability to select between these two combinations of erasing data in the card (i.e. any combinations of sectors in a single erase group; OR any combination of the entire erase groups) provides a great flexibility to the host to manage the storage of a MultiMediaCard card. This feature also increases the erasure speed of the MultiMediaCard card.

This aspect of the invention is accomplished by having a group tagging mechanism for tagging every memory group in the MultiMediaCard card, and a sector tagging mechanism within each group for tagging every memory sector within each memory group.

The MultiMediaCard card comprises a group tagging mechanism for tagging individual groups for erasure. Typically, the group tagging mechanism comprises a plurality of bits each corresponds to one memory group. Each tag indicates that the corresponding memory group should be erased or not. The group tags can be programmed by the MultiMediaCard host using the MultiMediaCard command as discussed below.

Each erasable unit (group and sector) has a special "tag" bit. This bit may be set or cleared by special commands to tag the unit. All tagged units will be erased in parallel by one erase command following a number of tag commands. All tag bits are cleared by each command except a tag or untag command. Therefore, immediately after a sequence of tag commands an erase command has to be sent by the host. Commands others than tagging or erasing abort a tag-erase cycle irregularly.

C. Erase Sector

As discussed above, the present invention allows any combination of sectors in a erase group be erased. FIG. 67 discloses a flow chart of a preferred embodiment for erasing a sector of storage spaces according to the present invention.

As shown in FIG. 67, the host starts with a TAG_SECTOR_START (CMD32) and a TAG_SECTOR_END (CMD33) commands. If the card accepts the command, the host may untag a sector within the tagged sector range using as many (up to 16) as needed UNTAG_SECTOR commands.

Once the erase sector(s) is tagged, the host will send an ERASE (CMD38) command. It is recommended that the host terminates the sequence with a SEND_STATUS (CMD13) to poll any additional status information the card may have (e.g. ERASE_WP_SKIP, etc.).

D. Erase Group

As discussed above, the present invention allows any combination of erase groups be erased.

Similarly, the erase group procedure starts with a TAG_GROUP_START (CMD35) and a TAG_GROUP_END (CMD36) commands. If the card accepts the command, the host may untag a sector within the tagged group range using as many (up to 16) as needed by the UNTAG_GROUP command.

Once the erase groups are tagged, the host will send an ERASE (CMD38) command. It is recommended that the host terminates the sequence with a SEND_STATUS (CMD13) to poll any additional status information the card may have (e.g. ERASE_WP_SKIP, etc.).

Basically, the erase group sequence is similar to the erase sector. In this sequence the TAG/UNTAG sector commands should be replaced with TAG/UNTAG group commands.

E. Software Implementation

Figure 68:
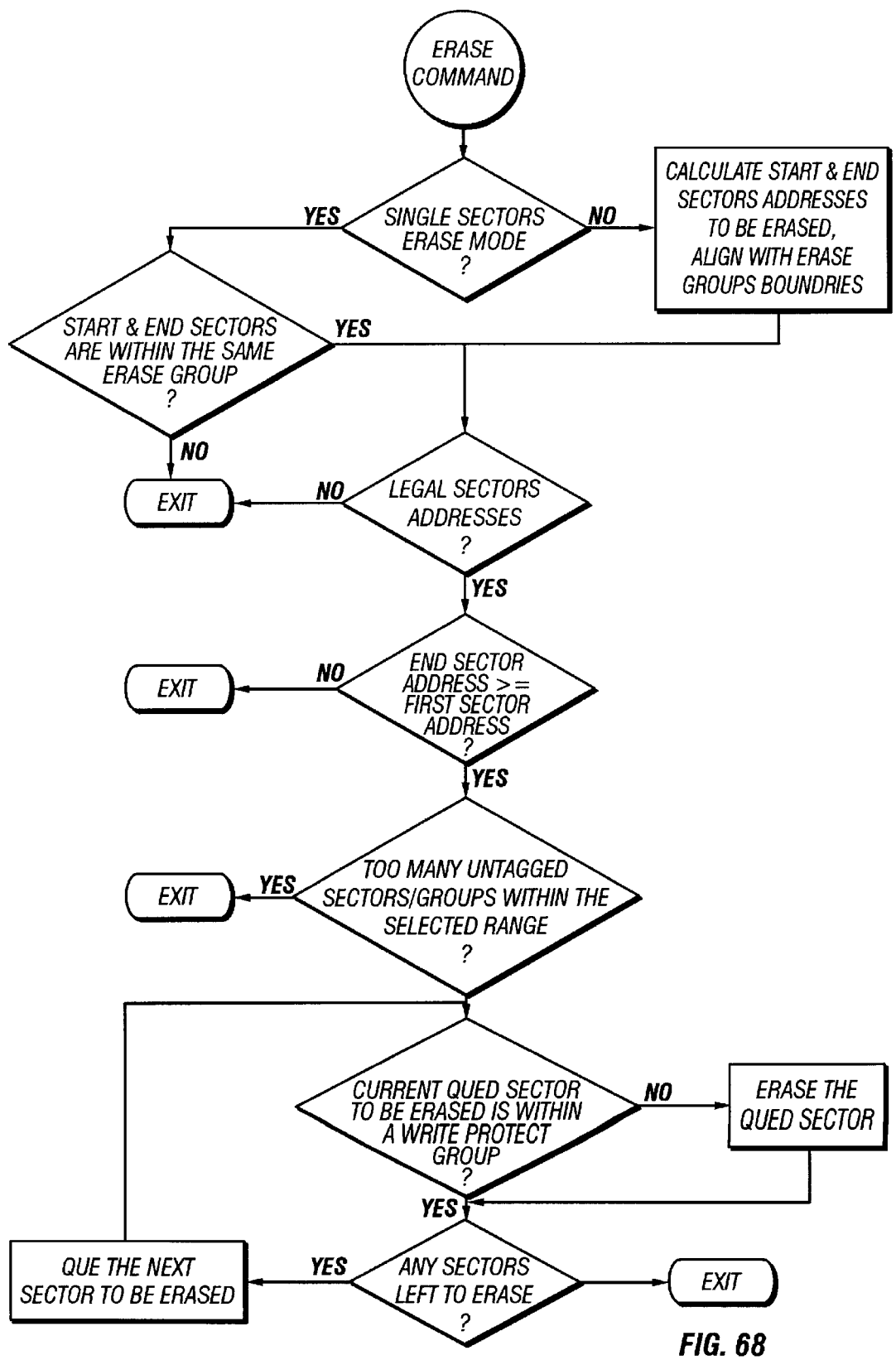
FIGS. 68 is a flow chart showing a preferred embodiment of implementing the erasure of sector/erase group feature of the present invention.

FIGS. 68 are flow charts showing a preferred embodiment for implementing the erasure of sector/erase group feature of the present invention.

As shown in the flow chart, the first step of an erase command is to determine whether the MultiMediaCard is in a single sector erase mode. If it is in a multiple sector erase mode, the starting and ending sectors addresses are calculated and aligns with the erase groups boundaries.

If the MultiMediaCard is in the single sector erase group, a determination is made to determine whether the starting and ending sectors fall within the same erase group. If they are not in the same erase group, the erase command is then aborted. If they are in the same erase group, a determination is made to determine whether the sector addresses are legal. If any of the sector addresses are not legal, then the erase command is aborted.

Then, another test is for determining whether the ending sector address is higher than the first sector address. The erase command will abort when the ending sector address is not higher than the first sector address. After that, another test is for determining whether there are too many untagged sectors/groups within the selected range. If there are too many untagged sectors/groups, then the erase command is abort.

After that, another test is performed to determine whether the current qued sector is to be erased within a write protect group. If the answer is no, the quad sector is erased. If the answer is yes, then continues erase sectors until all sectors are erased.

V. WRITE PROTECTION

Another aspect of the present invention is to allow the MultiMediaCard card to write protect any combination of groups of the memory.

The MultiMediaCard memory hierarchy is similar to the ERASE GROUP as discussed in the previous paragraph, however, the write protection is only applied to memory groups and not subdivided further into sectors.

Figure 69:
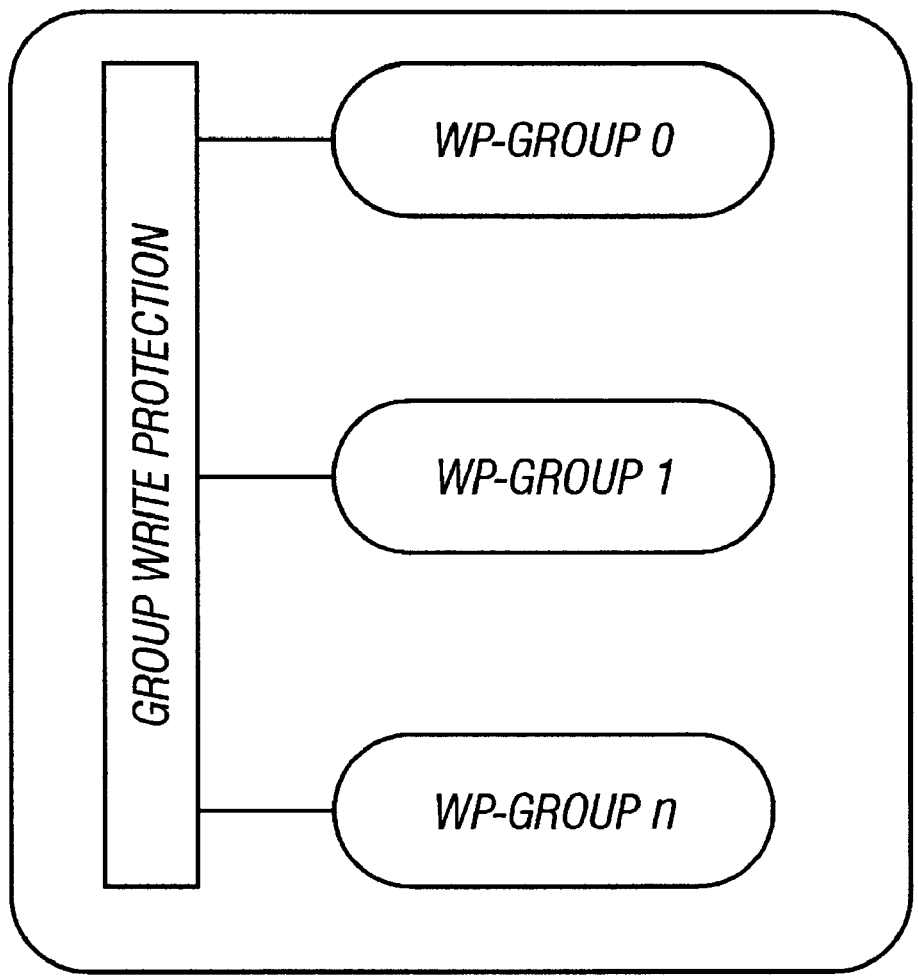
FIG. 69 shows the memory hierarchy of a MultiMediaCard card having a write protection mechanism of a preferred embodiment according to the present invention.

FIG. 69 shows the memory hierarchy for a MultiMediaCard card having a write protection mechanism of a preferred embodiment according to the present invention. The MultiMediaCard card as shown comprises a plurality of WP-Group (write protection group), and a group write protection mechanism. Similar to the ERASE mechanism, the group write protection mechanism, before each write request to a WP_GROUP, tests the corresponding tag bit of the WP_GROUP to determine whether the specific WP-GROUP is write protected. If the addressed group is write protected, the write requested will be denied.

The WP-Group is the minimal unit which may have individual write protection. Its size is the number of groups which will be write protected by one bit. The size of a WP-group is a configurable parameter and may be different for every card. The actual size is stored in the CSD register and the WP-group of a sector is calculated by firmware in real time.

Each WP-group has an additional write protection bit. The write protection bits can be programmed via special commands.

The entire card may be permanently write protected by the manufacturer or content provided by setting the permanent or temporary write protects bits in the CSD. For cards which support write protection of groups of sectors by stetting the WP_GRP_ENABLE bit in the CSD, portions of the data may be protected (in units of WP_GRP_SIZE sectors as specified in the CSD), and the write protection may be changed by the application.

The SET_WRITE_PROT command sets the write protection of the addressed write-protect group, and the CLR_WRITE_PROT command clears the write protection of the addressed write-protected group.

A macro command SEND_WRITE_PROT is similar to a single block read command. The card shall send a data block containing 32 write protection bits (representing 32 write protect groups starting at the specific address) followed by 16 CRC bits. The address field in the write protect commands is a group address in byte units. The card will ignore all LSB's below the group size.

Both functions are optional and only useful for writable/erasable devices. The write protection may also be useful for multi type MultiMediaCards (e.g. a ROM—Flash combination). The information about the available is stored in the CSD.

Figure 70:
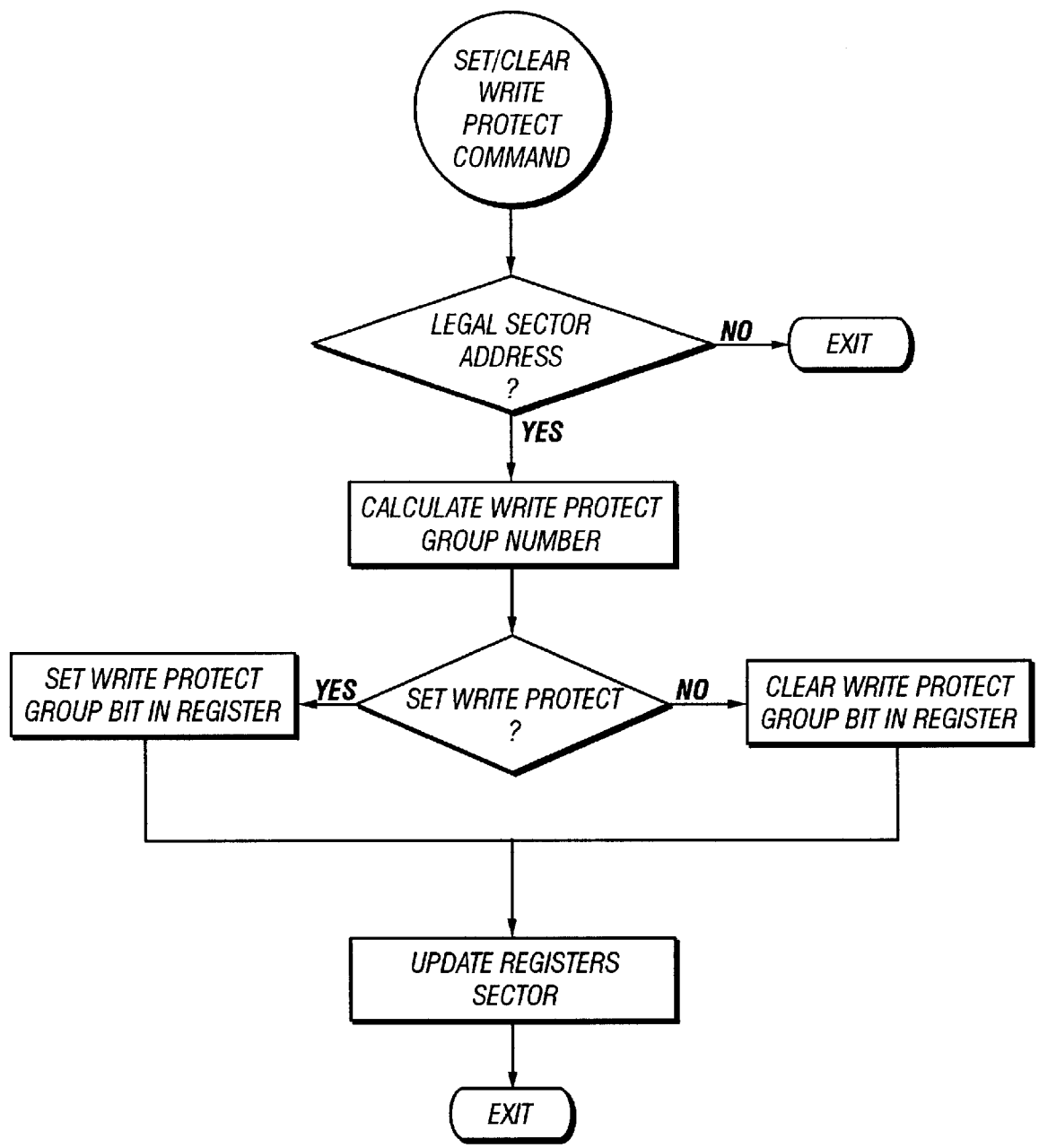
FIG. 70 is a flow chart showing a preferred embodiment of implementing the set/clear write protect feature of the present invention.

FIG. 70 shows a flow chart for the set/clear write protect command in a preferred embodiment of the present invention.

First, a determination is made to determine whether the sector address is legal. If the sector address is legal, the write protect group number is then calculated.

If the command is a "SET" write protect, then the appropriate write protect group bit located in the register is set. On the other hand, if the command is a "CLEAR" write protect, the appropriate write protect group bit is then cleared.

After that, the registers sector is then updated as shown in the flow chart.

VI. COPY PROTECTION

Another aspect of the present invention is to provide a method or apparatus in preventing unauthorized copying of the data stored in the MultiMediaCard card.

As discussed in the previous paragraph, the CSD register of the preferred embodiment according to the present invention comprises a COPY field. This COPY field located inside the card of the present invention defines if the contents is original (='0') or has been copied (='1'). For example, the COPY bit for one time programming "OTP" and multiple time programming "MTP" devices, sold to the end consumers, is set to '1' which identifies the card contents as a copy. By checking this COPY bit before the programming content is read from the card, the host can determine whether the CARD contains an original copy of the data. If the host determines that the data stored in the card is a copied version, the host can terminate any further access on the card. It should be noted that the COPY bit is preferably be designed as an one time programmable bit (using a OTP or simply as fuse inside the card) so that the consumers that bought a pre-set (COPY bit=1) cannot reset the card to be an original copy.

In order to implement the copyright protection scheme of the present invention for preventing use of a MultiMediaCard card loaded with unauthorized copied software, a copyright protection routine is attached at the start of the software loaded in the MultiMediaCard card. The copyright protection routine will be transferred to the host and executed at the beginning of every access of software loaded in the MultiMediaCard card. The routine will perform copyright protection checking to ensure that the card is an original copy.

Figure 71:
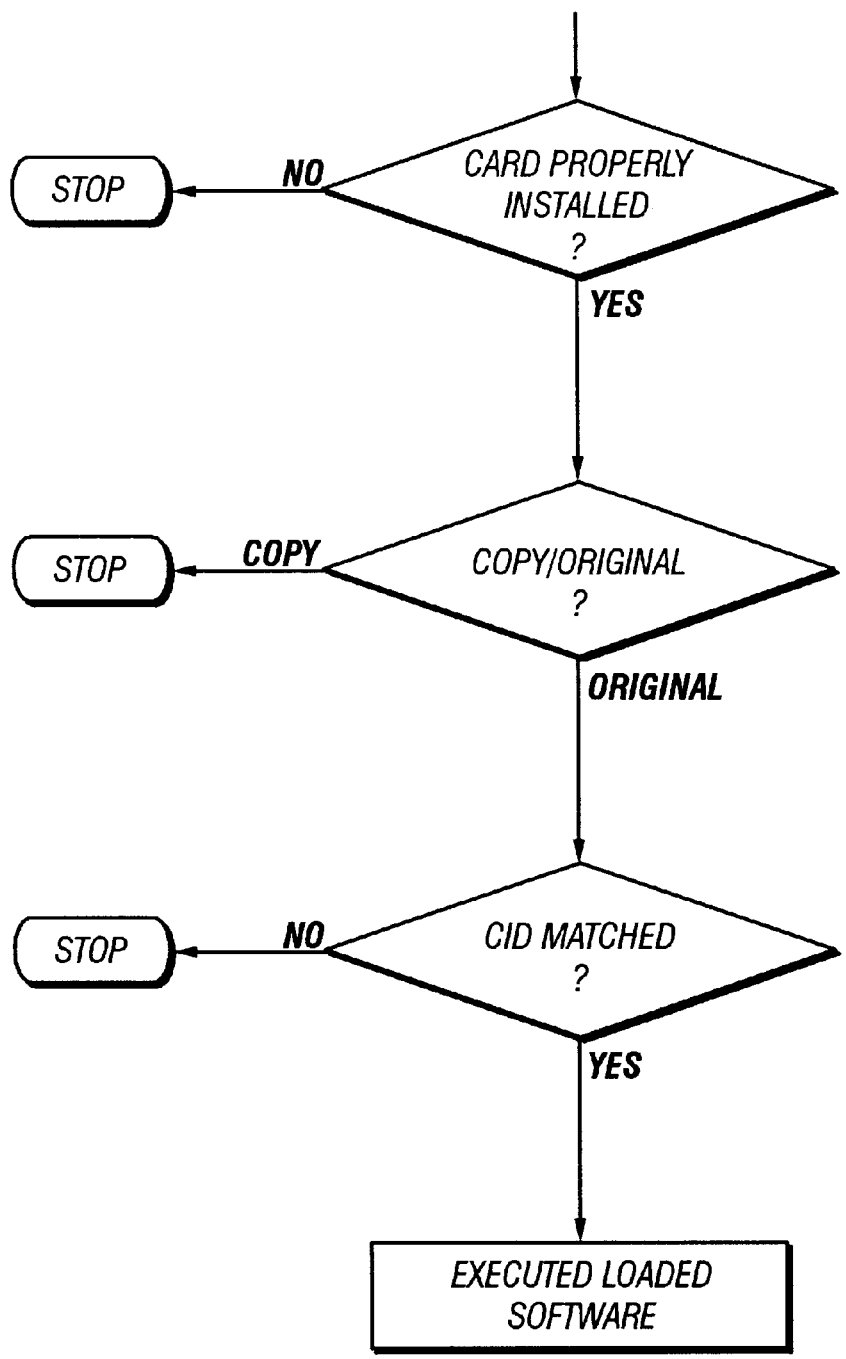
FIG. 71 shows a flowchart of the copyright protection scheme of a preferred embodiment according to the present invention.

FIG. 71 shows a flowchart of the copyright protection scheme of a preferred embodiment according to the present invention.

After the copyright protection routine is loaded into the host, the host will check whether the card is properly installed in the MultiMediaCard system. If the card is installed correctly, the host will request the card to provide the value of the copyright bit. If the copyright bit is set to "copy", the host will terminate further access to the card. If the copyright bit is set to "original", the host will request the card to provide with its CID so that the host can verify the authenticity of the card. If the CID of the card provided does not match the list of valid CIDs reserved for that particular software, the host will terminate further access to the card. If the CID number matches any one in the list of the valid CIDs, the host will start downloading and executing the loaded software.

It should be noted that the complete description of the MultiMediaCard system is disclosed in "The MultiMediaCard System Specification", Version 1.4 by the MMCA Technical Committee, and the document is hereby incorporated by reference in its entirety.

It is to be understood that while the invention has been described above in conjunction with preferred specific embodiments, the description and examples are intended to illustrate and not limit the scope of the invention, which is defined by the scope of the appended claims.

What is claimed is:

1. An apparatus comprising:
   a host;
   a plurality of cards connected to said host, each of said cards operating within an independent operating voltage range; and
   a voltage negotiator for determining a common operating voltage range, said common operating voltage range is a common denominator of all independent operating voltage ranges of all of said cards,
   wherein said host communicates with said cards within said common operating voltage range.

2. The apparatus according to claim 1, wherein said voltage negotiator is located in said host.

3. The apparatus according to claim 1, wherein each of said cards simultaneously provides the corresponding operating voltage range to said host.

4. The apparatus according to claim 3, each of said cards further comprises a plurality of data bits, said plurality of data bits representing the operating voltage range of the corresponding card.

5. The apparatus according to claim 4, wherein each of said cards provides the corresponding data bits to said host representing the operating voltage range.

6. The apparatus according to claim 5, wherein said voltage negotiator comprises a plurality of Wired-or gates, each of said wired-or gates connected in parallel with each of the cards.

7. The apparatus according to claim 6, wherein said common operating voltage is represented by a plurality of data bits located inside the host.

8. The apparatus according to claim 1, wherein at least one of said card is a memory card.

9. The apparatus according to claim 1, wherein at least one of said card is an interface card.

10. In a memory system comprising a host, a plurality of cards connected to said host, wherein data is transferred between said cards and said host, a method of determining a common operating voltage range for operating said memory system, comprising:
    each of said cards providing an independent operating voltage range to said host; and
    finding a common denominator of said independent operating voltage ranges provided by said cards, said common denominator is the common voltage range.

11. The method according to claim 10, wherein the independent operating voltage ranges are simultaneously provided to said host by said cards.

12. The method according to claim 11, wherein said independent operating voltage ranges are stored in a plurality of data bits in the corresponding cards.

13. The method according to claim 12, said finding step comprises:
    wiring AND all the independent operating voltage ranges provided by said cards.

14. The method according to claim 13, said host comprising a plurality of data bits for storing said common operating range.

15. The method according to claim 10, wherein at least one of said cards is a storage device.

16. The method according to claim 10, wherein at least one of said cards is an interface device.

* * * * *